United States Patent
Moriya et al.

(10) Patent No.: US 7,230,551 B2
(45) Date of Patent: Jun. 12, 2007

(54) FLOATING-POINT TYPE DIGITAL SIGNAL REVERSIBLE ENCODING METHOD, DECODING METHOD, APPARATUSES THEREFOR, AND PROGRAMS THEREFOR

(75) Inventors: Takehiro Moriya, Nerima-ku (JP); Dai Yang, San Diego, CA (US)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/554,739

(22) PCT Filed: Jun. 21, 2004

(86) PCT No.: PCT/JP2004/008726

§ 371 (c)(1),
(2), (4) Date: Oct. 28, 2005

(87) PCT Pub. No.: WO2004/114527

PCT Pub. Date: Dec. 29, 2004

(65) Prior Publication Data

US 2006/0284747 A1 Dec. 21, 2006

(30) Foreign Application Priority Data

Jun. 20, 2003 (JP) ............................. 2003-176224

(51) Int. Cl.
*H03M 7/02* (2006.01)
(52) U.S. Cl. .......................................... 341/83; 341/51
(58) Field of Classification Search .................. 341/50, 341/51, 83; 708/550, 200, 204, 206
See application file for complete search history.

(56) References Cited

U.S. PATENT DOCUMENTS 6,535,898 B1 * 3/2003 Yuval .......................... 708/204
6,879,992 B2 * 4/2005 Zohar .......................... 708/550

FOREIGN PATENT DOCUMENTS

| JP | 2001-044847 | 2/2001 |
| JP | 2003-332914 | 11/2003 |
| WO | 03/077425 | 9/2003 |

OTHER PUBLICATIONS (online) "Tensilica Decoder Implementation Receives Dolby Certification", Oct. 31, 2001, pp. 1-2, XP002388229. Liebchen, T., "MPEG-4 Audio Lossless Coding (ALS)" (Online), May 28, 2004, pp. 1-4, XP002388230.
Yang, Dai et al., "A Lossless Audio Compression Scheme With Random Access Property", ICASSP 2004, IEEE 2004, pp. 1016-1019, XP10718365, no month.
Moriya et al. "Sampling Rate Scalable Lossless of Acoustic Signals", Forum on Information Technology, separate vol. 2, pp. 227-228, with English translation 2002, no month.
Hans et al. "Lossless Compression of Digital Audio", IEEE Signal Processing Magazine, pp. 21-32 2001, no month.

* cited by examiner

*Primary Examiner*—Brian Young
(74) *Attorney, Agent, or Firm*—Oblon, Spivak, McClelland, Maier & Neustadt, P.C.

(57) ABSTRACT

Signal samples X in a floating-point format, each of which is composed of 1 bit of sign S, 8 bits of exponent E and 23 bits of mantissa M, are converted through truncation by an integer formatting part 12 into signal samples Y in a 24-bit integer format, the integer-value signal samples Y are coded by a compressing part 13 into a code sequence Ca, and the code sequence Ca is output. According to the number of digits n following the most significant "1" in the integer-value signal sample Y, a difference producing part 14 extracts the least significant (23−n) bits from the mantissa M of the input signal sample X to form a difference signal Z, and a compressing part 17 performs entropy coding of the difference signal Z to produce a code sequence Cb and outputs the code sequence Cb. Alternatively, the difference signal Z may be output as it is, rather than being compressed.

29 Claims, 19 Drawing Sheets

| n | INTEGER ABSOLUTE VALUE $X_W$ | 23-BIT MANTISSA M | | | |
|---|---|---|---|---|---|
| -127 | 0 | $0._{P_D} X_{23}$ | $X_{22}$ | ...... | $X_1$ |
| 0 | 1 | $1._{P_D} X_{23}$ | $X_{22}$ | ...... | $X_1$ |
| 1 | 2~3 | $\lceil 1 \ X_{23} \rceil . X_{22}$ (2 BITS) | | ...... | $X_1$ |
| 2 | 4~7 | $\lceil 1 \ X_{23} \ X_{22} \rceil . X_{21}$ (3 BITS) | | ...... | $X_1$ |
| k-1 | $2^{k-1}$~$(2^k-1)$ | $\lceil 1 \ X_{23} \ X_{22} \ ... \ X_{23-(k-2)} \rceil . X_{23(k-1)}$ (k BITS) | | ... | $X_1$ |
| 22 | $2^{22}$~$(2^{23}-1)$ | $\lceil 1 \ X_{23} \ ...... \ X_2 \rceil . X_1$ (23 BITS) | | | |

FIG. 5

| INTEGER ABSOLUTE VALUE $X_W$ | SIGN S AND EXPONENT E | MANTISSA M |
|---|---|---|
| 0 | NO CONSTRAINT | NO CONSTRAINT |
| 1 | 0 | NO CONSTRAINT |
| 2~3 | 0 | MOST SIGNIFICANT ONE BIT 0 |
| 4~7 | 0 | MOST SIGNIFICANT TWO BITS 0 |
| — | — | — |
| $2^{k-1}$~$(2^k-1)$ | 0 | MOST SIGNIFICANT (k−1) BITS 0 |
| $2^{22}$~$(2^{23}-1)$ | 0 | MOST SIGNIFICANT 22 BITS 0 |

| n | |
|---|---|
| 14 | $2^{14} \leq X_W < 2^{15}$ |
| . | . |
| . | . |
| . | . |
| . | . |
| . | . |
| . | . |
| 3 | $2^3 \leq X_W < 2^4$ |
| 2 | $4 \leq X_W < 7$ |
| 1 | $2 \leq X_W < 3$ |
| 0 | $X_W = 1$ |

FIG. 15B

| n | |
|---|---|
| 14 | $2^{14} \leq X_W < 2^{15}$ |
| . | . |
| . | . |
| . | . |
| . | . |
| . | . |
| . | . |
| . | . |
| 3 | $2^3 \leq X_W < 2^4$ |
| 2 | $4 \leq X_W < 7$ |
| 1 | $2 \leq X_W < 3$ |
| 0 | $X_W = 1$ |

FIG. 18

| SAMPLE NUMBER i | INTEGER VALUE | REQUIRED NUMBER OF DIGITS h | FRACTIONAL PART OF MANTISSA |
|---|---|---|---|
| 0 | 90 | 23-6 | |
| 1 | 300 | 23-8 | |
| 2 | 43 | 23-5 | |
| 3 | 65 | 23-6 | |
| 4 | 3 | 23-1 | |
| 5 | 5 | 23-2 | |
| ... | ... | | |
| i | ... | | |
| ... | ... | | |
| 1023 | 8 | 23-3 | |

$E_0\ E_1\ E_2\ E_3 \cdots E_j \cdots E_{16}\ E_{17}\ E_{18}\ E_{19}\ E_{20}\ E_{21}$

FIG. 21

| SAMPLE NUMBER i | INTEGER VALUE | REQUIRED NUMBER OF DIGITS h |
|---|---|---|
| 0 | 90 | 23-6 |
| 1 | 300 | 23-8 |
| 2 | 43 | 23-5 |
| 3 | 65 | 23-6 |
| 4 | 3 | 23-1 |
| 5 | 5 | 23-2 |
| ... | ... | |
| i | ... | |
| ... | ... | |
| 1023 | 8 | 23-3 |

FIG. 22

| SAMPLE NUMBER i | INTEGER VALUE | REQUIRED NUMBER OF DIGITS h |
|---|---|---|
| 0 | 90 | 23-6 |
| 1 | 300 | 23-8 |
| 2 | 43 | 23-5 |
| 3 | 65 | 23-6 |
| 4 | 3 | 23-1 |
| 5 | 5 | 23-2 |
| ... | ... | |
| i | ... | |
| ... | ... | |
| 1023 | 8 | 23-3 |

FIG. 23

| SAMPLE NUMBER i | INTEGER VALUE | REQUIRED NUMBER OF DIGITS h |
|---|---|---|
| 0 | 90 | 23-6 |
| 1 | 300 | 23-8 |
| 2 | 43 | 23-5 |
| 3 | 0 | 32* |
| 4 | 3 | 23-1 |
| 5 | 5 | 23-2 |
| ... | ... | |
| 1023 | 8 | 23-3 |

*SEPARATELY $E_0$ $E_1$ $E_2$ $E_3$ ... $E_j$ ... $E_{16}$ $E_{17}$ $E_{18}$ $E_{19}$ $E_{20}$ $E_{21}$

FLOATING-POINT TYPE DIGITAL SIGNAL REVERSIBLE ENCODING METHOD, DECODING METHOD, APPARATUSES THEREFOR, AND PROGRAMS THEREFOR

This application is a 371 of PCT/JP04/08726 filed on Jun. 21, 2004.

TECHNICAL FIELD

The present invention relates to a coding method for compressing a digital sound, music or image signal into a code of smaller information quantity, a corresponding decoding method, a coding apparatus therefor, a decoding apparatus therefor, and programs therefor.

BACKGROUND ART

As a method for compressing sound or image information, there is known a lossless coding method that involves no distortion.

Highly compressive lossless data compression can be achieved by combining a highly compressive lossy coding and a lossless compression of the difference between a signal reproduced from the result of the highly compressive lossy coding and the original signal. Such a combined compression method has been proposed in the patent literature 1. The method, which is described in detail in the patent literature, will be described briefly below.

In a coder, a frame forming part successively separates digital input signals (referred to also as an input signal sample sequence) into frames, each of which is composed of 1024 input signal samples, for example, and the digital signals are lossily compression-coded on the frame basis. This coding can be based on any format that is suitable for the input digital signal and can reproduce the original digital input signal with a certain fidelity by decoding. For example, if the digital input signal is a sound signal, a speech coding recommended according to ITU-T recommendation G.729 can be used. If the digital input signal is a music signal, a transform-domain weighted interleaved vector quantization (Twin VQ) coding used in MPEG-4 can be used. The code resulting from the lossy compression coding is locally decoded, and a difference signal that represents the difference between the locally decoded signal and the original digital signal is produced. Actually, however, there is no need of local decoding and, instead, it is possible to obtain the difference between the original digital signal and a quantized signal resulting during the lossy compression coding. The amplitude of the difference signal is typically much smaller than that of the original digital signal. Thus, the quantity of information can be reduced by the lossless compression coding of the difference signal, compared with the lossless compression coding of the original digital signal.

To enhance the efficiency of the lossless compression coding, for a sequence of all samples of the difference signal in a frame each expressed by the sign and magnitude notation (a binary number of sign and magnitude), bits at each position, that is, bits at each of the MSB, the second MSB, . . . , and the LSB are linked along the sample sequence (that is, the time series) to form a respective bit sequence. In other words, the bit arrangement is transformed. For convenience, the bit sequence composed of linked 1024 bits at the equal bit position is referred to as a "coordinate bit sequence". On the other hand, a one-word bit sequence representing the amplitude value of each sample including its sign is referred to as an "amplitude bit sequence", for convenience. The difference signal has a small amplitude, and therefore, the most significant bit is, or the most significant bit and the following plural bits are, often all "0". The coordinate bit sequence formed by linking the bits at such a bit position is a bit sequence of "0". Therefore, the coordinate bit sequence can be represented by a predetermined short code, and thus, the efficiency of the lossless compression coding of the difference signal can be enhanced.

The coordinate bit sequence is losslessly compression-coded. As the lossless compression coding, an entropy coding, such as Huffman coding and arithmetic coding, can be used which takes advantage of the occurrence or frequent occurrence of a sequence in which the same sign (1 or 0) successively appears.

When decoding, the code resulting from the lossless compression coding is decoded, and the inverse transformation of bit arrangement is performed on the decoded signal. That is, the coordinate bit sequences are converted into the amplitude bit sequences for each frame, and the resulting difference signals are reproduced sequentially. In addition, the code resulting from the lossy compression coding is decoded, the decoded signal and the reproduced difference signal are summed together, and then, the sum signals for each frame are linked together sequentially, thereby reproducing the original digital signal sequence.

Besides, there are known a variety of lossless coding methods for audio or visual information that permit no distortion. For example, a lossless coding method for music information is disclosed in the non-patent literature 1. Any conventional methods are such one that performs compression coding on a PCM signal directly derived from a signal waveform.

However, in music recording studios, a waveform is sometimes recorded and stored in the floating-point format. Any value in the floating-point format is separated into a sign, an exponent and a mantissa. For example, in the IEEE 754 standard floating-point format shown in FIG. 1, any value consists of 32 bits including 1 bit for sign, 8 bits for exponent and 23 bits for mantissa in the descending order of significance. Denoting the sign by S, the value of 8 bits for exponent by a decimal number E and the binary number for mantissa by M, the value in the floating-point format can be represented in the sign and magnitude binary notation as follows.

$$(-1)^S \times 1.M \times 2^{E-E_0} \qquad (1)$$

According to the IEEE 754 standard, $E_0$ is defined as $E_0=2^7-1=127$, so that the "$E-E_0$" in the expression (1) can be any value falling within the range:

$$-127 \leq E-E_0 \leq 128.$$

Here, it is defined that all the bits are set at "0" when $E-E_0=-127$, and all the bits are set at "1" when $E-E_0=128$.

In the case where sound, music or image information is represented by a digital signal sequence in the floating-point format, the bit sequence composed of "0"s and "1"s is likely to be random because of the characteristics of the floating-point format. Thus, even if the bit arrangement transformation described above is performed, the entropy compression coding or the like cannot be expected to provide a high compression ratio. Furthermore, the sample sequence in the floating-point format significantly differs from the original analog waveform, so that there is no redundancy due to correlation between samples. Therefore, even if the lossless predictive coding method disclosed in the non-patent literature 1 described above is applied, a higher compression ratio cannot be expected. Patent literature 1: JP Application Kokai Publication No. 2001-44847 Non-patent literature 1: "Lossless Compression of Digital Audio" by Mat Hans, Ronald W. Schafer et al., IEEE SIGNAL PROCESSING MAGAZINE, July 2001, pp. 21–32

DISCLOSURE OF THE INVENTION

ISSUES TO BE SOLVED BY THE INVENTION

An object of the present invention is to provide a lossless coding method for a digital signal in the floating-point format that permits no distortion and has a high compression ratio, a corresponding decoding method, apparatus therefor and programs therefor.

MEANS TO SOLVE ISSUES

A coding method and a coder according to the present invention involve converting a first signal sample in a floating-point format into a second signal sample in an integer format by truncation so that the absolute value thereof is reduced, losslessly compressing the second signal sample in the integer format to produce a first code sequence and outputting the first code sequence, producing a difference signal in the floating-point format that corresponds to the difference between the second signal sample in the integer format and the first signal sample in the floating-point format, and producing and outputting a second code sequence that corresponds to a range of bits each capable of being non-zero in the difference signal in the floating-point format, the range of bits being determined by the number of bits following the most significant "1" in the second signal sample in the integer format.

In this way, by converting into the second signal sample in the integer format, which approximates to the waveform of the original analog signal, highly efficient compression can be achieved by a compression method that eliminates a redundancy due to correlation between signal samples, and only the bits capable of being non-zero in the difference signal can be efficiently output as difference information.

A decoding method and a decoder according to the present invention involves decoding and expanding a first code sequence to produce a first signal sample in an integer format, producing a difference signal in a floating-point format from a second code sequence based on the number of digits capable of being non-zero that is determined by the number of bits following the most significant "1" in the first signal sample, converting the first signal sample in the integer format into a second signal sample in the floating-point format, and combining the second signal sample in the floating-point format and the difference signal in the floating-point format to produce a third signal sample in the floating-point format.

EFFECTS OF THE INVENTION

According to the present invention, a digital signal sample sequence in the floating-point format can be efficiently compressed. In addition, a typical compression-coding module designed for a signal sample sequence in the integer format can be used, and both the integer format and the floating-point format can be handled without increasing significantly the scale of the processing apparatus and the program.

BRIEF DESCRIPTION OF THE DRAWINGS

FIG. 5 shows a relationship between the absolute value of an integer value and the bit sequence of a mantissa of floating point that represents the integer value;

FIG. 6 shows a relationship between the absolute value of an integer value, the sign, the exponent and the mantissa of a digital difference signal;

FIG. 15A is a diagram showing a range of bits of a mantissa that can be non-zero in the case shown in FIG. 14A;

FIG. 15B is a diagram showing a range of bits of a mantissa that can be non-zero in the case shown in FIG. 14B;

FIG. 18 is a diagram for illustrating a process of coding a mantissa by scanning the bits thereof in a frame direction;

FIG. 21 is a diagram for illustrating another way of scanning bits in the frame direction;

FIG. 22 is a diagram for illustrating another way of scanning bits in the frame direction;

FIG. 23 is a diagram for illustrating another way of scanning bits in the frame direction;

BEST MODES FOR CARRYING OUT THE INVENTION

FIRST EMBODIMENT

Figure 1:
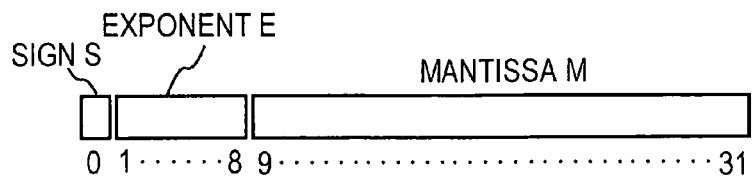
FIG. 1 shows a format of 32-bit floating point representation according to the IEEE-754.
Figure 2:
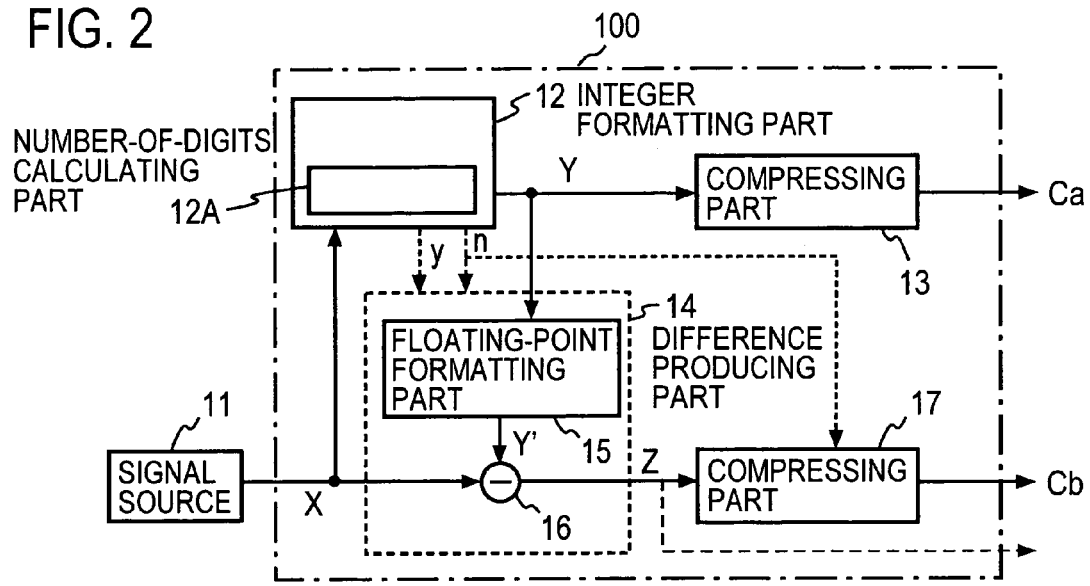
FIG. 2 is a functional diagram of a coder according to a first embodiment of the present invention.

FIG. 2 shows a functional configuration of a coder according to an embodiment of the present invention. A coder 100 according to this embodiment comprises an integer formatting part 12, a compressing part 13, a difference producing part 14, and a compressing part 17. The integer formatting part 12 has a number-of-digits calculating part 12A, and the difference producing part 14 comprises a floating-point formatting part 15 and a subtraction part 16. For example, a signal source 11 outputs a music signal sample sequence as a sequence of input digital signal samples X (simply referred to also as input signal samples X, hereinafter) in the 32-bit floating-point format. Each of the digital signal samples X is produced by performing a processing, such as transformation, amplitude adjustment, effect addition and mixing, on a raw signal recorded in the 24-bit integer format and converting the resulting signal having a fractional part as a result of the processing into the floating-point format, or produced by converting a raw signal recorded in the 24-bit integer format into the 32-bit floating-point format and performing such processing as described above on the resulting signal.

Figure 3:
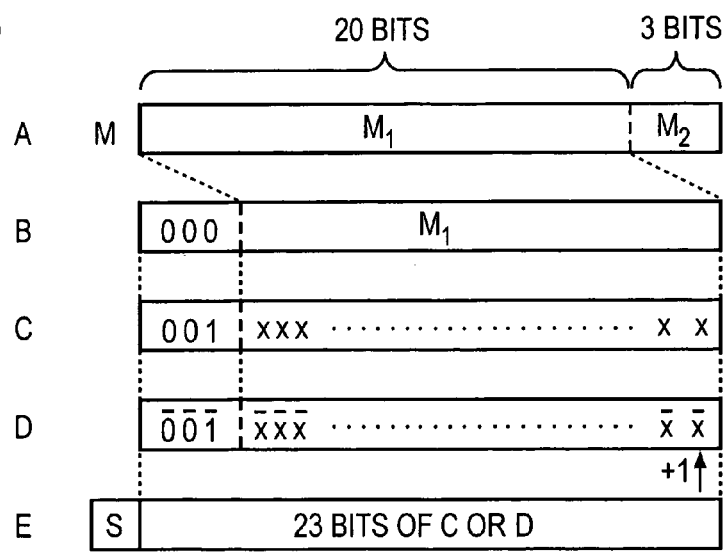
FIG. 3 is a diagram for illustrating an operation of an integer formatting part 12 shown in FIG. 2.

Input samples X in the floating-point format are input to the integer formatting part 12, and each sample is converted into a digital signal sample Y in the integer format (simply referred to also as an integer-value signal sample, hereinafter). As described above, in the example described above, the digital signal sample X is often derived from a raw signal in the 24-bit integer format through a processing, such as transformation, amplitude adjustment and sound effect addition, so that the amplitude of the signal typically does not vary significantly. Thus, in the following, a case where the integer formatting part 12 truncates the fractional part will be described with reference to FIG. 3. While the number of digits of the integer format may be 16 bits, 20 bits or the like, it will be assumed in the following description that the number of digits of the integer format is 24 bits.

To represent a waveform in the floating-point format, normalization may be performed so that an integer value of 32768 ($=2^{15}$) is normalized to 1.0, or an integer value of $2^{23}$ is normalized to 1.0. However, these cases differ from the case described below only in the value of the exponent but don't have an essential difference.

If the exponent value E is 147, for example, the bit adjacent the decimal point on its higher order side is the 20th (147−127) bit from the MSB in the mantissa M. As shown in FIG. 3A, the most significant 20 bits ($M_1$) in the 23-bit mantissa M constitute a part following the most significant "1" in the integer part of a number expressed in the sign and magnitude binary notation, and the remaining three least significant bits ($M_2$) in the mantissa M constitute the fractional part below the decimal point of the number expressed in the sign and magnitude binary notation. In the following, the part $M_1$ will be referred to as an integer part of the mantissa M. Therefore, as shown in 3B, if the mantissa M is shifted by three bits toward the least significant bit position so that the least significant bit in the integer part ($M_1$) of the mantissa is positioned at the least significant bit in the entire 23-bit mantissa, overflow of the three bits ($M_2$) below the decimal point occurs, and thus, the three bits are truncated. Then, the least significant bit in the most significant three unoccupied bits ("000" in this example) caused by such shifting (that is, the 21st bit from the least significant bit) is set at 1, which corresponds to "1" of "1.M" in the expression (1), thereby providing a truncated integer value (see FIG. 3C). Alternatively, "1" may be added before the most significant bit of MSB in the 23 bits before shifting, and the resulting 24 bits may be shifted by three bits.

Furthermore, the resulting integer value is converted into a two's complement notation. That is, the sign bit S of each digital signal sample X in the floating-point format is uses as it is as the most significant bit, and as for the other 23 bits, if the sign S is "0" (positive), the 23 bits shown in FIG. 3C are used as they are, and if the sign S is "1" (negative), the 23 bits are logically inverted as shown in FIG. 3D, that is, the values "0" and "1" are interchanged, and then, "1" is added to the least significant bit. As the most significant bit, the sign bit S is used as it is. In this way, a signal sample Y in the 24-bit integer format represented in the complement notation is obtained as shown in FIG. 3E.

The above description has been made generally on the assumption that the mantissa M contains 0 or more bits corresponding to the fractional part, and a 32-bit digital signal sample in the floating-point format is converted into a 24-bit digital signal sample in the integer format. However, for example, in the case where a plurality of raw signals in the 24-bit integer format are mixed for processing, one sample may have an amplitude value that is significantly greater than the maximum value that can be represented by 24 bits. In such a case where E≧150, as an exceptional processing, the value of the exponent E is fixed to 150 (E=127+23=150) in the example described above, an exception signal y is provided to the difference producing part 14, and the most significant 23 bits of the "1M", which is the mantissa M with "1" added at the top thereof, is converted into the two's complement notation to produce a signal sample Y in the 24-bit integer format. Alternatively, as will be described later with reference to another embodiment, in order that each frame falls within an appropriate integer value range, the exponent of the floating-point number may be adjusted using an adjustment value ΔE, and the adjustment value ΔE may be coded as auxiliary information.

Figure 4:
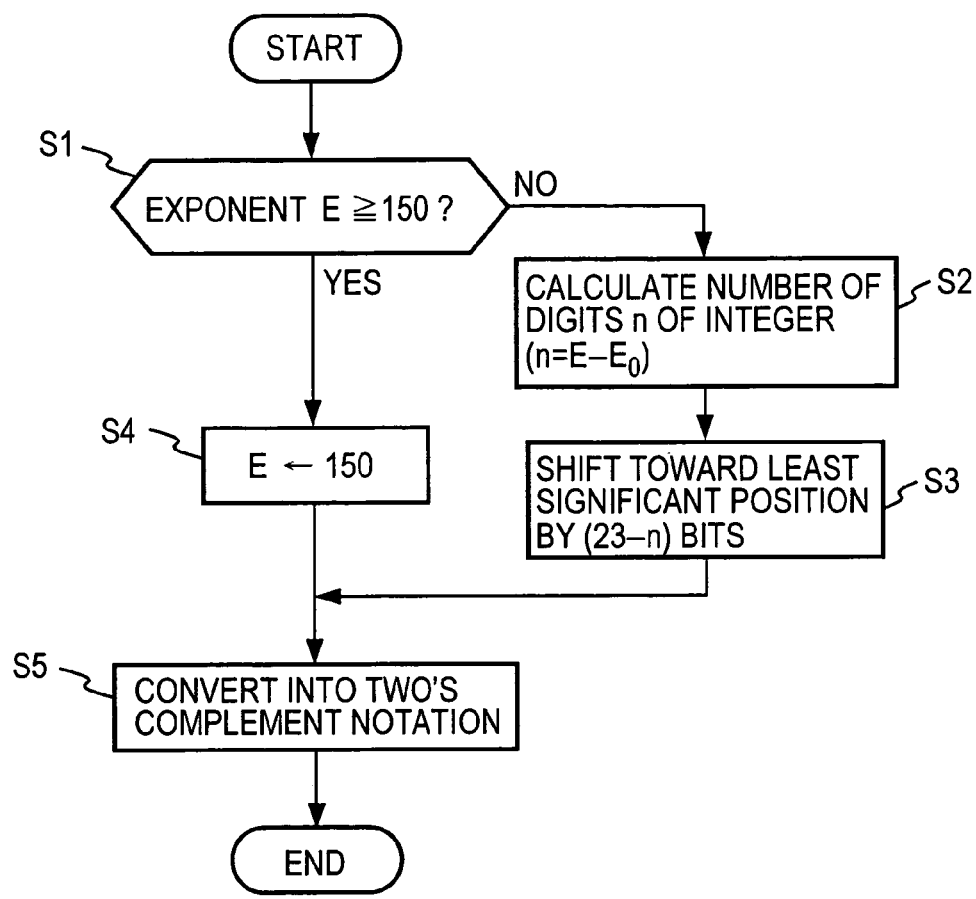
FIG. 4 is a flowchart showing a procedure performed in the integer formatting part 12 shown in FIG. 2.

The integer formatting part 12 performs a processing shown in FIG. 4, for example. First, it is determined whether the exponent E is equal to or greater than 150 or not, that is, whether the integer part is constituted by 23 or more bits or not (S1). If the integer part is constituted by less than 23 bits, the number-of-digits calculating part 12A determines the number of digits n (n=E−$E_0$) of the integer part of the mantissa and outputs the result (S2). Then, the mantissa M is shifted by (23−n) bits toward the least significant position to make overflow of the fractional part occur, and "1" is placed at the (n+1)th bit position viewed from the least significant bit of the resulting integer part composed of n bits (S3). Then, "0"s are placed at the remaining bit positions preceding the (n+1)th bit so that the whole mantissa is composed of 23 bits, and based on the sign bit S, the resulting 23 bits are converted into the 24-bit integer format represented in the two's complement notation, thereby producing a signal sample Y in the integer format (S5). More specifically, the sign S is used as the most significant bit as it is, and as for the remaining 23 bits, if the sign S is "0" (positive), the bits, from the least significant bit to the 23rd bit, of the integer part resulting from the shifting and the addition of "1" to the (n+1)th bit from the least significant bit in step S3 are used as they are, and if the sign S is "1" (negative), the bits, from the least significant bit to the 23rd bit, of the integer part resulting from the shift and the addition of "1" are each inverted, and "1" is added to the least significant bit of the resulting 23 bits to provide a value in the complement notation. If the exponent E is equal to or greater than 150 in step S1, the exponent E is set at 150 in step S4, and then, a signal sample Y in the integer format is produced from the most significant 23 bits of the "1M" in step S5.

In the above description, the mantissa M is shifted by (23−n) bits to provide a 24-bit integer value sample in the sign and magnitude binary notation. Alternatively, most significant n bits (n=E−$E_0$) of the mantissa M shown as $M_I$ in FIG. 3A may be extracted, "1" be added at the top of the n bits to make the number of bits (n+1) as shown in FIG. 3C, (22−n) bits of "0"s be added at the top of the (n+1) bits to make the number of bits 23, and then the sign bit S be added at the top of the 23 bits to make the number of bits 24.

A sequence of the digital signal samples Y in the integer format produced by the integer formatting part 12 as described above is, as an integer value, compression-coded in the compressing part 13 by an efficient lossless compression method using correlation with a waveform or the like, and then output as a code sequence Ca. For example, as disclosed in the non-patent literature 1 described above, the lossless compression in the compressing part 13 may be achieved by calculating a difference between the value of each sample and a predicted value (integer value), transforming the bit arrangement of a sequence of such differences as described in the part "BACKGROUND ART", and then performing the entropy coding on the resulting sequence, that is, the coordinate bit sequence. That is, the sequence of the integer-value signal samples Y approximates to the original analog signal waveform from which the sequence of the input digital signal samples X from the signal source 11 has been derived. Therefore, the sequence of the input samples X can be efficiently losslessly compression-coded by eliminating, by prediction or transformation, the redundancy due to the correlation between the signal samples.

The difference producing part 14 produces a difference signal (error) Z, which indicates the difference between the integer-value signal sample Y and the corresponding input signal sample X in the floating-point format from the signal source 11. In this example, the floating-point formatting part 15 converts the integer-value signal sample Y again into a signal sample Y' in the floating-point format, and the subtraction part 16 subtracts the resulting signal sample Y' in the floating-point format from the original input signal sample X in the floating-point format, thereby producing the difference digital signal Z in the floating-point format.

In the case where the digital signal sample in the integer format is composed of 24 bits, the floating-point formatting part 15 can convert the digital signal into an input signal in the 32-bit floating-point format without any ambiguity or exception. As described above, the exponent E of the original digital signal sample X in the floating-point format is likely to be equal to or less than 149, and in such a case, the difference signal Z indicating the difference between the digital signal sample Y' and the original input signal sample X in the floating-point format equals to the value of the fractional part of the original input signal sample X.

The above description concerning the difference producing part 14 is intended only to help understanding of the present invention, and actually, there is no need of converting the integer-value signal sample Y into the floating-point format. The input sample X and the number of digits n of the integer part of the mantissa thereof are input to the difference producing part 14, and if no exception signal y is provided, the sign S, the exponent E and the least significant (23−n) bits of the mantissa M of each input sample X in the floating-point format are used as the sign S, the exponent E and the least significant (23−n) bits of the mantissa of each difference signal sample Z, respectively, and the remaining most significant n bits of the mantissa are all set at "0". The number of digits n (n=E−$E_0$) of the integer part of the mantissa is equal to the number of digits following the most significant "1" in the integer-value signal sample Y. If an exception signal y is provided, the sign of the difference signal sample Z is constituted by the sign S of the input signal, the exponent of the difference signal sample Z is set at E−150, and the mantissa of the difference signal sample Z is constituted by the difference between the mantissa of the input sample X and the signal sample Y'.

The compressing part 17 performs a lossless compression coding on the difference signal Z for each integer-value signal sample Y and a corresponding input sample X in the floating-point format, that is, the difference signal Z in the floating-point format from the difference producing part 14, and outputs a code sequence Cb. The compressing part 17 performs the lossless compression coding only on those digits in the difference signal Z in the floating-point format that can assume a value other than "0" for each sample, using the number of digits n of the integer part of the mantissa that is output from the integer formatting part 12. Each input sample X in the floating-point format is expresses as follows:

$$X=1.M\times 2^n = X_W.X_F$$

Supposing that $X_W=1M_I$ ($M_I$ with "1" added at the top thereof) indicates the integer part in the binary notation, and $X_F=M_F$ indicates the fractional part, the bits corresponding to the integer part $M_I$ in the mantissa M and the bits corresponding to the fractional part (decimal value) $M_F$ are related to each other as shown in FIG. 5. In this drawing, the mantissa M is shown as in a 24-bit value including the one bit attached at the top of the M in the expression (1), and the position of a decimal point $P_D$ in the sign and magnitude binary notation is shown for the purpose of convenience.

When the integer absolute value $X_W$ is 0, the expression (1) can be classified into two cases: a case of E−$E_0$=−127; and a case of −126≦E−$E_0$≦−1. The former case is a special case of E=0, in which all the 23 bits "$x_{23}$ ... $x_1$" of the mantissa M constitute the fractional part $M_F$, and the 23 bits of the mantissa M of the input signal sample X are all "0" by definition. In the case of −126≦E−$E_0$≦−1, the mantissa constitutes the fractional part, but not all the bits thereof are "0". In any case, in the case where E−$E_0$ assumes a negative value, all the bits of the integer-value signal sample Y are "0", and the difference signal Z is the same as the input sample X, so that all the 32 bits of the signal sample X in the floating-point format are to be coded.

When the integer absolute value $X_W$ is 1, the bit "1" at the position one bit higher than the 23rd bit of the mantissa M (referred to as a 24th bit, hereinafter) represents the integer part $X_W$, and the 23 bits "$x_{23}$ ... $x_1$" of the mantissa M represent the fractional part $M_F$.

When the integer absolute value $X_W$ is 2 to 3, the two bits "$1x_{23}$" composed of the 24th bit "1" and the 23rd bit $x_{23}$ represent the integer value $X_W$, in which the bit $x_{23}$ represents the integer part $M_1$ in the mantissa M, and the remaining 22 bits "$x_{22} \ldots x_1$" represent the fractional part $M_F$.

When $X_W$ is 4 to 7, the three bits "$1x_{23}x_{22}$" composed of the 24th bit "1", the 23rd bit $x_{23}$ and the 22nd bit $x_{22}$ represent the integer value $X_W$, in which the bits "$x_{23}x_{22}$" represent the integer part $M_1$ in the mantissa M, and the remaining 21 bits "$x_{21} \ldots x_1$" represent the fractional part $M_F$.

When $X_W$ is $2^{k-1}$ to $2^k-1$, the k bits composed of the 24th bit "1" and the bits "$x_{23} \ldots x_{23-(k-2)}$" represent the integer value $X_W$, in which the bits "$x_{23}x_{22} \ldots x_{23-(k-2)}$" represent the integer part $M_1$ in the mantissa M, and the remaining (23−k) bits "$x_{23-(k-1)} \ldots x_1$" represent the fractional part $M_F$.

Since the difference signal Z is produced by subtracting the sample Y' in the 32-bit floating-point format converted from the integer-value signal sample Y from the input sample X in the 32-bit floating-point format, the difference signal Z is as shown in FIG. 6. In the case where the integer absolute value $X_W$ is 0, which corresponds to the above-described case where $E-E_0$ assumes a negative value, the sign S, the exponent E and the mantissa M of the difference signal Z are all the same as those of the input sample X.

In the case where the integer absolute value $X_W$ is 1, the sign S and the exponent E of the sample Y' are the same as those of the sample X, and the mantissa M of the sample Y' is 0. In this case, subtraction of exponents is also performed. Thus, the sign S and the exponent E of the difference signal Z are always 0 because the sign and exponent of the sample Y' are the same as those of the sample X, and the mantissa M of the difference signal Z is the same as the mantissa M of the sample X.

In the case where the integer value $X_W$ is 2 to 3, the sign S and the exponent E of the sample Y' are the same as those of the sample X, and as for the mantissa M of the sample Y', the 23rd bit $x_{23}$ thereof is the same as that of the mantissa M of the sample X, and the bits constituting the fractional part "$x_{22} \ldots x_1$" thereof are all "0". Therefore, the sign S and the exponent E of the difference signal Z are always 0, the most significant bit (the 23rd bit) in the mantissa M is always 0, and the remaining bits constituting the fractional part "$x_{22} \ldots x_1$" are the same as the respective corresponding bits of the sample X and vary depending on the sample X.

Similarly, in the case where the integer value $X_W$ of the sample X is $2^{k-1}$ to $2^k-1$, the sign S and the exponent E of the difference signal Z are always 0, and as for the mantissa M thereof, the most significant (k−1) bits "$x_{23} \ldots x_{23-(k-2)}$" corresponding to the integer part of the mantissa M of the sample X are always 0, and the remaining 23-(k−1) bits "$x_{23-(k-1)} \ldots x_1$" are the same as the respective corresponding bits of the mantissa M of the sample X and vary depending on the sample X. The number of digits h (h=23−n) of the difference signal Z that can be non-zero is determined depending on the range of the integer value of the digital signal sample Y in the integer format, that is, the number of digits n of the integer value.

Because of such a relationship, the compressing part 17 performs a lossless compression coding only on the least significant h (h=23−n) bits that can be non-zero in the difference signal Z in the floating-point format, using the number of digits n of the integer part of the mantissa input from the integer formatting part 12. That is, if the number of digits n of the integer part of the mantissa is 0, all the bits of the exponent E and the mantissa M are losslessly compression-coded, and if the number of digits n is not 0 (n≠0), only the least significant h (h=23−n) bits of the mantissa M are losslessly compression-coded. From the above description, it will be understood that the difference signal Z can be produced by inputting the input signal sample X and the number of digits n of the integer part of the mantissa to the difference producing part 14.

Figure 7:
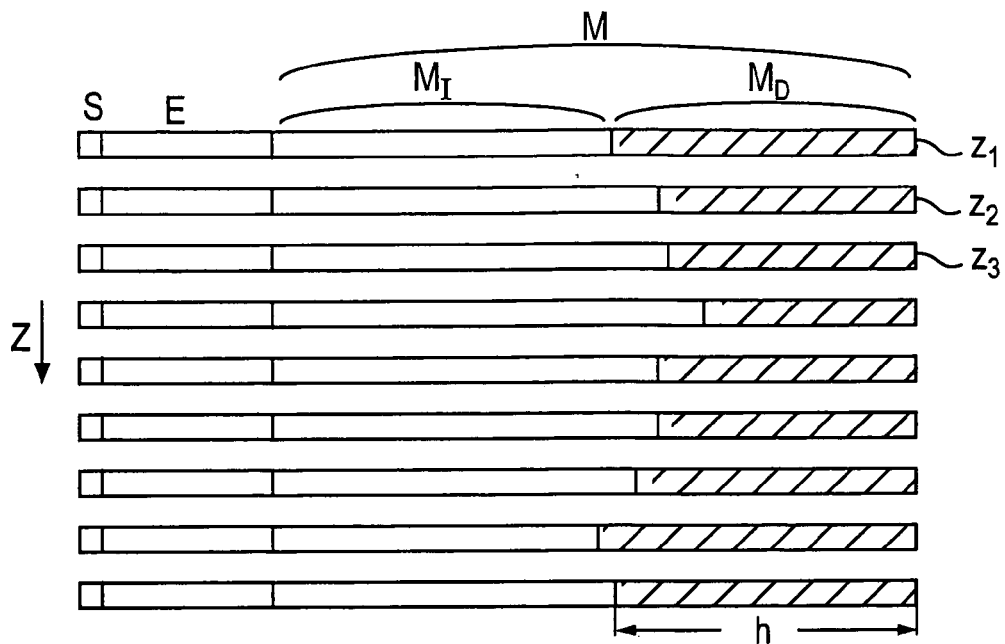
FIG. 7 is a diagram showing parts to be compression-coded of a sequence of digital difference signals.

As described above, when the value of $E-E_0$ in the expression (1) of the input signal sample X is from −127 to 0, the difference signal Z is the same as the input signal sample X. Therefore, the compressing part 17 codes the 32 bits of the input signal sample as the difference signal Z. When the value of $E-E_0$ is 1 to 22, in the case where the difference signal sample sequence Z ($=z_1, z_2, z_3, \ldots$) is as shown in FIG. 7, for example, only the part $M_D$ constituted by the bits that can be non-zero is coded, except the case where n≠0. The coding of the bits that can be non-zero can be achieved by entropy coding, such as Huffman coding, of h bits that can be non-zero, or by universal coding of the whole of the bits. That is, only the part shaded in FIG. 7 can be appropriately grouped into samples or frames and simply losslessly compression-coded, such as entropy-coded, on a sample basis or on a frame basis. The sign S is contained in the code Ca as a result of coding of the digital signal sample Y in the integer format, and therefore, there is no need of coding and transmitting the sign S when coding the difference signal Z. In addition, since the $n=E-E_0$ can be determined from the number of bits n following the most significant "1" except the sign bit of the integer-value signal sample Y on the receiver side, there is no need of transmitting the number of bits n.

The difference signal Z sometimes has a large number of digits below the decimal point, and in such a case, the coding efficiency may be reduced. Thus, the bits that can be non-zero in the difference signal Z may be output as a code sequence Cb without being coded. Alternatively, the quantity of information of the difference signal Z is compared between the case where coding is performed and the case where no coding is performed, and the difference signal Z of smaller quantity of information may be selected.

As described above, in the exceptional case where the exponent E of the digital signal sample X in the floating-point format holds E≧150, the integer formatting part 12 provides an exception signal y, which indicates that the exponent E is fixed to 150, to the difference producing part 14, and the difference producing part 14 produces a difference signal Z in the floating-point format whose exponent is constituted by the difference (E−150) between the fixed exponent value of 150 and the exponent E of the digital signal sample X and whose mantissa is constituted by the difference in mantissa M. The compressing part 17 losslessly compression-codes the difference signal Z and outputs the resulting code sequence Cb.

Figure 8:
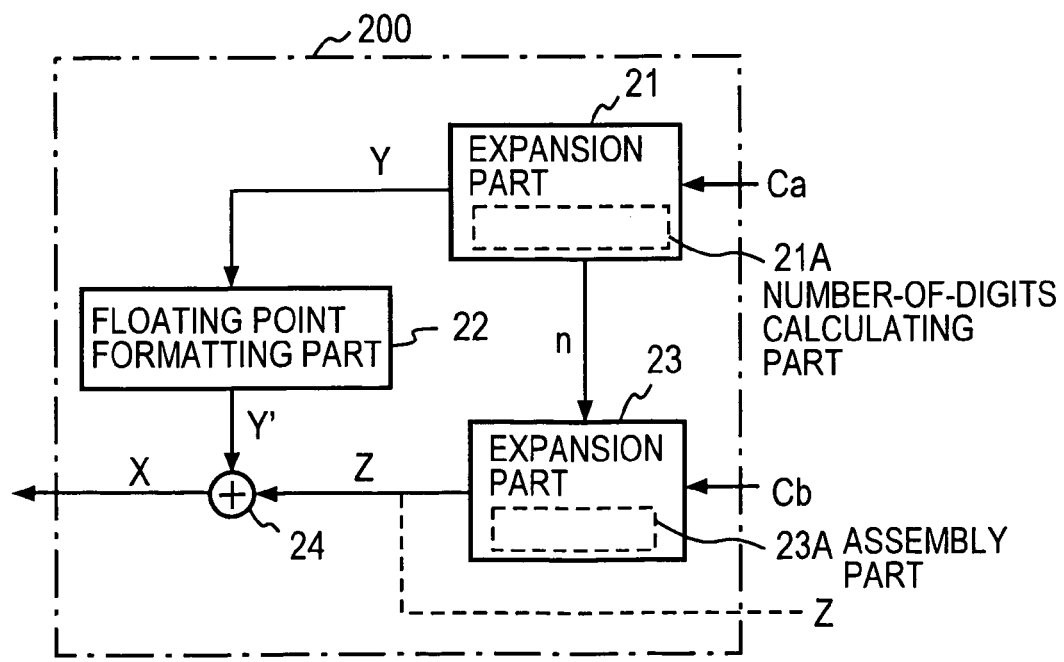
FIG. 8 is a functional diagram of a decoder according to the first embodiment of the present invention.

FIG. 8 shows a decoder 200 according to this embodiment of the present invention, which is associated with the coder 100 shown in FIG. 2.

The input code sequence Ca is losslessly expansion-decoded in an expansion part 21. This lossless expansion decoding corresponds to the lossless compression coding performed in the compressing part 13 shown in FIG. 2 and is to perform an inverse processing of the lossless compression coding. Therefore, this lossless expansion decoding produces a digital signal sample Y in the 24-bit integer format. In addition, a number-of-digits calculating part 21A in the expansion part 21 determines the number of digits n following the most significant "1" in each expansion-decoded sample as the number of digits of the integer part of the mantissa of the corresponding sample in the floating-point format, and provides the number of digits n to an expansion part 23.

The expansion part 23 losslessly expansion decodes the input code sequence Cb. This lossless expansion decoding corresponds to the lossless compression coding performed in the compressing part 17 shown in FIG. 2. Therefore, in the expansion part 23, an assembly part 23A assembles a sequence of expansion-decoded bits into a difference (error) signal Z in the 32-bit floating-point format for each sample based on the number of digits n, and outputs the resulting difference signal Z. In the case where the difference signal Z is output from the compressing part 17 in the coder 100 shown in FIG. 2 without being coded, the code sequence Cb received at the expansion part 23 in the decoder 200 is used as it is as the difference signal Z.

Based on the number of digits n for the first sample provided from the expansion part 21, if the number of bits n for the first sample does not hold n=0, the assembly part 23A extracts the least significant h (h=23−n) bits from the 23-bit mantissa M of the bit sequence expansion-decoded by the expansion part 23 and assembles the extracted h bits into a difference signal $z_1$ in the 32-bit floating-point format, which is constituted by the shaded part of the first sample $z_1$ shown in FIG. 7. 1 bit of sign S and 8 bits of exponent E are all set to 0, and all the bits constituting the part $M_r$ of the mantissa M corresponding to the integer part shown in FIG. 7 are set to 0. For the next sample, based on the number of digits n (n≠0), h (h=23−n) bits are extracted from the expansion-decoded bit sequence to form a difference signal Z in the 32-bit floating-point format. Similarly, sample sequences $z_2$, $z_3$, ... shown in FIG. 7 are successively assembled and output. If n=0 holds, 8 bits of exponent E and 23 bits of mantissa M are extracted from the expansion-decoded bit sequence and assembled into a digital signal in the floating-point format. The sign bit S of the decoded difference signal Z is always 0, the bits of the exponent E thereof are always 0 except the case where n=0, the least significant h (h=23−n) bits of the mantissa M thereof can be non-zero, and the remaining bits of the mantissa M thereof are always 0. Thus, it is to be noted that the difference signal is referred to as a difference signal in the floating-point format, although the difference signal is not in the floating-point notation in a strict sense.

The digital signal sample Y in the 24-bit integer format from the expansion part 21 is converted into a digital signal sample Y' in the 32-bit floating-point format by the floating-point formatting part 22. A combining part 24 combines the digital signal sample Y' with the respective difference signal Z in the floating-point format from the expansion part 23 to reproduce the digital signal sample X in the floating-point format. The sign of each reproduced digital sample X is the same as that of the digital signal sample Y', that is, the same as the sign of the decoded digital signal sample Y in the integer format. Except for the case where n=0, the exponent E of the sample X is the same as that of the signal sample Y', the most significant n (n=23−h) bits of the mantissa M are the same as the most significant n bits of the mantissa of the signal sample Y', and the remaining, least significant h (h=23−n) bits thereof are the same as the least significant h bits of the difference signal Z.

MODIFIED EMBODIMENT

There are sometimes cases where an original 24-bit or 16-bit integer-value PCM signal is converted into a floating-point number for the purpose of convenience to form a sequence to be coded instead of using an ordinary floating-point number signal to produce a sequence to be coded. In the case of such a special floating-point sequence, the bits that can be non-zero described above with reference to the first embodiment don't occur. Thus, the sign S, the exponent E and the mantissa M of the difference (error) signal Z in the floating-point format from the difference producing part 14 are all zero, and there is no need of transmitting the difference signal Z. For example, this means that two bits are used as auxiliary information, and if the two bits are "00", it means that the original digital signal is a 16-bit integer-value signal sample, if the two bits are "01", it means that the original digital signal is a 24-bit integer-value signal sample, and if the two bits are "10", it means that the original digital signal is a signal sample other than those described above. By adding such 2-bit auxiliary information at the top of the code sequence Ca output from the compressing part 13, and inhibiting the code sequence Cb in the former two cases, and permitting the code sequence Cb in the latter case, it is possible to achieve efficient compression.

SECOND EMBODIMENT

In the above description of the embodiment shown in FIG. 2, the exceptional processing is performed on a sample whose exponent E holds E ≧150. However, as briefly described earlier, digit adjustment may be performed on a frame basis to avoid the situation of E≧150. In the following, an embodiment in which digit adjustment is performed so that the maximum value of the exponents E of the samples in a frame falls within a range of 150>E≧150−K will be described with reference to FIG. 9.

Figure 9:
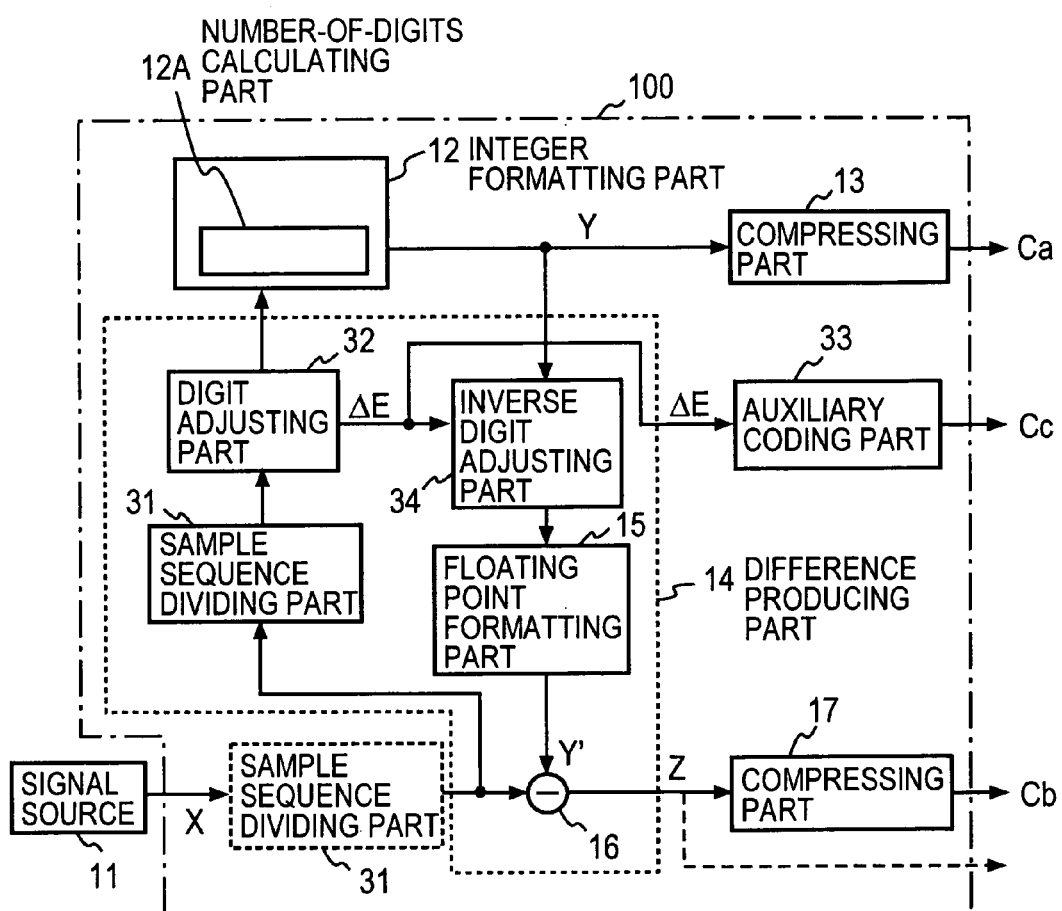
FIG. 9 is a functional diagram of a coder according to a second embodiment of the present invention.

FIG. 9 is a functional diagram of a coder 100 according to a second embodiment of the present invention, in which the parts corresponding to those in FIG. 2 are denoted by the same reference numerals as in FIG. 2. According to the second embodiment, a sample sequence dividing part 31 divides a sequence of digital signal samples X in the floating-point format into blocks of a predetermined number of samples or into frames, and a digit adjusting part 32 performs digit adjustment on the exponent E for each divisional unit (i.e. for each block or frame) so that the number of digits of a digital signal sample Y in the integer format falls within an appropriate range, that is, the number of digits of a digital signal sample in the integer format converted from the digital signal sample X becomes equal to or less than 24, as described below.

(a) If a digital signal sample X in the floating-point format that has a large amplitude and an exponent E greater than 150 is converted into a 24-bit digital signal sample Y in the integer format, the information represented by one or more least significant bits of the mantissa M of the digital signal sample X is lost. Besides, if a digital signal sample X in the floating-point format, that has a large amplitude and an exponent E close to 150, is converted into a digital signal sample Y in the integer format, the digital value of the sample often exceeds the 24-bit integer value. In order to avoid these, for each divisional unit, the digit adjusting part 32 subtracts adjustment information ΔE from the exponent E of the digital signal sample X to make the value of the exponent E equal to or less than 150.

(b) If a digital signal sample X in the floating-point format that has a small amplitude is converted into a 24-bit digital signal sample Y in the integer format, and most significant 21 to 23 bits except for the sign bit S, which is the most significant bit, of the 24 bits of the digital signal sample Y in the integer format are all "0", the amplitude can be represented by only about 2 bits. Thus, the waveform of the sequence of the digital signal samples Y in the integer format does not approximate to the analog waveform, and therefore, the advantage of the conversion into the digital signal sample Y in the integer format, that is, the advantage of the lossless compression coding with a high compression ratio cannot be obtained. In addition, in the case where the amplitude value of the digital signal sample Y in the integer format is represented by about two least significant bits thereof, if the signal sample Y is converted in to a digital signal in the floating-point format, almost all the bits of the mantissa M of the resulting digital signal may become "0". For example, all of them become "0", or all of them except for the most significant bit, which is "1", become "0". On the other hand, the mantissa M of the input digital signal sample X in the floating-point format can assume a great value even if the amplitude of the signal sample X is small. Therefore, the mantissa M of the difference signal ΔX in the floating-point format, which corresponds to the error (difference) from that of the digital signal sample X in the floating-point format, may have a large amplitude. That is, the number of bits that are "0" for all the samples is reduced, so that the compression efficiency cannot be raised.

In order to avoid such a problem, the digit adjusting part 32 adds adjustment information ΔE to each exponent E for each divisional unit (i.e., block or frame), so that as much information represented by the mantissa M as possible is contained in the digital signal sample Y in the integer format. In this case, the number of bits of one sample resulting from the conversion into the integer format should not be greater than 24.

The adjustment information ΔE (an integer of any sign) in the digit adjusting part 32 can be changed for each divisional unit. The digit adjusting part 32 finds the maximum one of the exponents E in each divisional unit and determines the adjustment information ΔE for the divisional unit so that as much information represented by the mantissa M as possible can be utilized while keeping the number of bits of one sample in the integer format equal to or less than 24.

Figure 10:
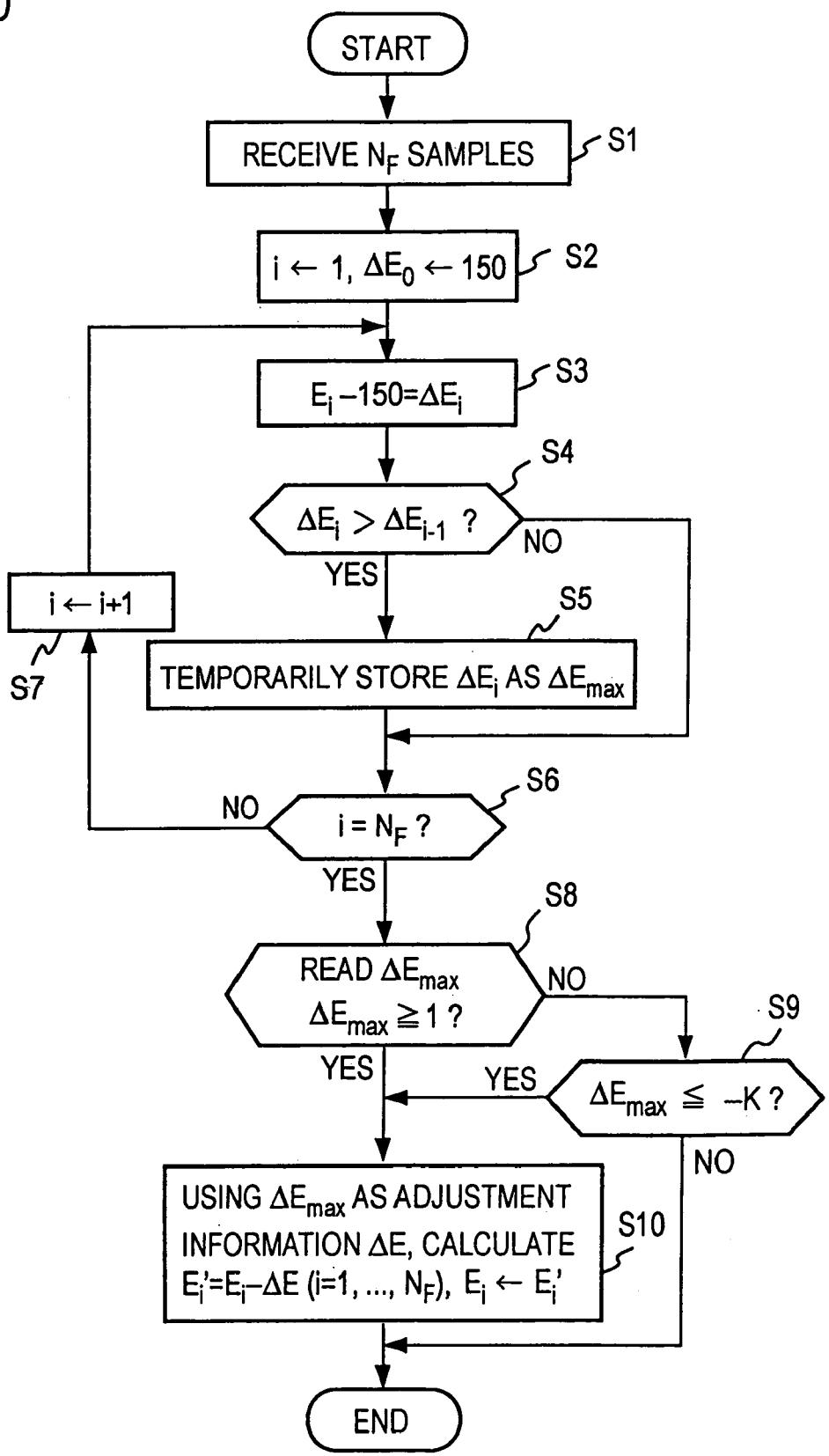
FIG. 10 is a flowchart showing a digit adjustment procedure.

FIG. 10 shows a procedure of the digit adjustment performed for each frame by the digit adjusting part 32. This drawing shows a case where the sample sequence dividing part 31 divides a sample sequence by $N_F$ samples, and the digit adjustment is performed for $N_F$ samples as a unit.

In step S1, $N_F$ input samples are received, and in step S2, the value i is initially set at 1 (i=1), and the value $\Delta E_0$ is initially set at an impossible, sufficiently small value, for example, −150 ($\Delta E_0$=−150).

In step S3, 150 is subtracted from the exponent $E_i$ of the i-th sample to produce the difference $\Delta E_i$.

In step S4, it is determined whether or not the difference $\Delta E_i$ is greater than the difference $\Delta E_{i-1}$ for the preceding (i−1)th sample. If the difference $\Delta E_i$ is not greater than the difference $\Delta E_{i-1}$, the process continues to step S6.

If the difference $\Delta E_i$ is greater than the difference $\Delta E_{i-1}$ in step S5, the difference $\Delta E_i$ is regarded as the maximum difference $\Delta E_{max}$ and temporarily saved.

In step S6, it is determined whether or not i=$N_F$. If it is determined that i is not equal to $N_F$, the number of i is incremented by 1 in step S7, and then, the process returns to step S3.

If it is determined that i=$N_F$ in step S6, in step S8, the maximum difference $\Delta E_{max}$ is read out, and it is determined whether or not the difference $\Delta E_{max}$ is equal to or greater than 1. If the difference $\Delta E_{max}$ is equal to or greater than 1, the process continues to step S10.

If the difference $\Delta E_{max}$ is less than 1 in step S8, in step S9, it is determined whether or not the difference $\Delta E_{max}$ is equal to or less than −K, where K is a predetermined integer equal to or greater than 1. If the difference $\Delta E_{max}$ is equal to or less than −K, the process continues to step S10.

In step S10, using the maximum difference $\Delta E_{max}$ as adjustment information ΔE, the digit of each of the $N_F$ samples is adjusted according to a relation of $E_i'=E_i-\Delta E$, the resulting $N_F$ samples adjusted in digit and containing the resulting $E_i'$ instead of the original E' are provided to the integer formatting part 12, and then the process is ended. If the difference $\Delta E_{max}$ is more than −K in step S9, the process is ended.

Thus, if the difference $\Delta E_{max}$ is equal to or greater than 1 in step S8, it means that the amplitude of the digital signal sample X is large, and the exponent E is greater than 150. If the difference $\Delta E_{max}$ is equal to or less than −K in step S9, it means the amplitude of the digital signal sample X is small, and the degree of waveform approximation is poor. For example, K can be set at a value from 20 to 22.

As in the first embodiment, the digital signal sample in the floating-point format having been adjusted in digit in this way is converted into a digital signal sample Y in the integer format in the integer formatting part 12, and the sequence of such signal samples Y is losslessly compression-coded in the compressing part 13 to produce a code sequence Ca. Furthermore, as for the difference signal Z, as in the first embodiment, the bits in the mantissa M that can be non-zero are coded in the compression coding part 17, and the code sequence Cb is output.

In order that decoding can reproduce losslessly the original digital signal sample X in the floating-point format before coding, an auxiliary coding part 33 codes the adjustment information ΔE including the sign, which indicates addition or subtraction, to produce an auxiliary code sequence Cc.

In the embodiment shown in FIG. 9, an inverse digit adjusting part 34 in the difference producing part 14 performs an inverse digit adjustment, by the adjustment information ΔE for the corresponding divisional unit, on the digital signal sequence Y in the integer format. That is, if the digit adjusting part 32 adds negative adjustment information ΔE (if ΔE is negative in step S10), the inverse digit adjusting part 34 shifts the 23 bits, excluding the most significant bit, of the corresponding digital signal sample toward the least significant position by ΔE bits, in other words, makes overflow of ΔE bits occur, and fills the bit positions made unoccupied by the shifting with "0"s. If the digit adjusting part 32 adds positive adjustment information ΔE (if ΔE is positive in step S10), the inverse digit adjusting part 34 shifts the 23 bits, excluding the most significant bit, of the corresponding digital signal sample toward the most significant position by ΔE bits, and fills the least significant bit positions made unoccupied by the shifting with "1"s to make the number of bits 23+ΔE.

The digital signal sample Y in the integer format having been inverse-adjusted in digit is converted into a digital signal sample Y' in the floating-point format by the floating-point formatting part 15. The difference Z between the digital signal sample Y' in the floating-point format and the original digital signal sample X in the floating-point format is obtained by the subtraction part 16. The difference signal Z is losslessly compression-coded by the compressing part 17, and the resulting code sequence Cb is output. In this embodiment again, only the fractional part of the difference signal Z may be output as it is as the difference information, rather than compression-coding the difference signal Z. As shown by a dashed line in FIG. 9, the sample sequence dividing part 31 may be provided so as to supply the divisional sequences of digital signal samples X in the floating-point format to both the digit adjusting part 32 and the subtraction part 16.

Figure 11:
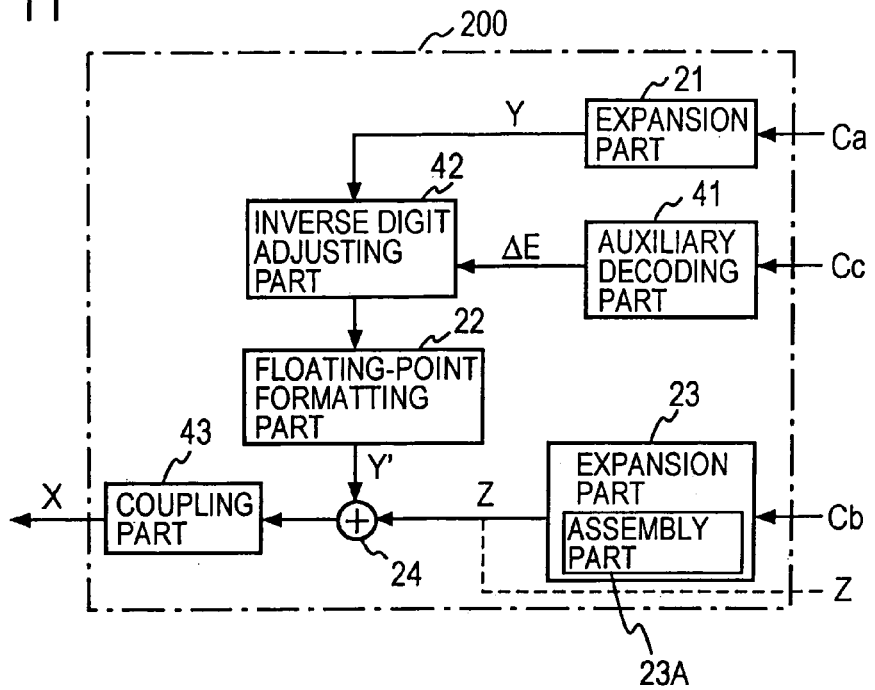
FIG. 11 is a functional diagram of a decoder according to the second embodiment of the present invention.

FIG. 11 shows a functional arrangement of a decoder 200 associated with the coder 100 shown in FIG. 9, whose parts corresponding to the parts of the decoder 200 shown in FIG. 8 are denoted by the same reference numerals. An expansion part 21 losslessly expansion-decodes the code sequence Ca for each divisional unit, thereby producing a sequence of digital signal samples Y in the integer format. In this embodiment, an auxiliary decoding part 41 decodes the auxiliary code Cc to produce adjustment information ΔE. Based on the adjustment information ΔE, an inverse digit adjusting part 42 performs digit adjustment, by $E_i+\Delta E$, on the digital signal samples Y in the integer format. If the adjustment information ΔE is positive, the bits digital signal sample Y is shifted toward the most significant bit position by ΔE bits. If the adjustment information ΔE is negative, the bits of each digital signal sample Y is shifted toward the least significant bit position by ΔE bits. In this process, as with the inverse digit adjusting part 34 shown in FIG. 9, the bit positions made unoccupied by the shifting are filled with "1"s or "0"s.

The digital signal samples in the integer format from the inverse digit adjusting part 42 are converted into digital signal samples Y' in the floating-point format by the floating-point formatting part 22. Each digital signal sample Y' and a difference signal Z in the floating-point format, which is derived from the difference information Cb through inverse expansion decoding by an expansion part 23, are combined together. As required, a coupling part 43 couples the combination digital signals into a sample sequence, thereby reproducing the sequence of digital signal samples X in the floating-point format.

MODIFIED EMBODIMENT

Figure 12:
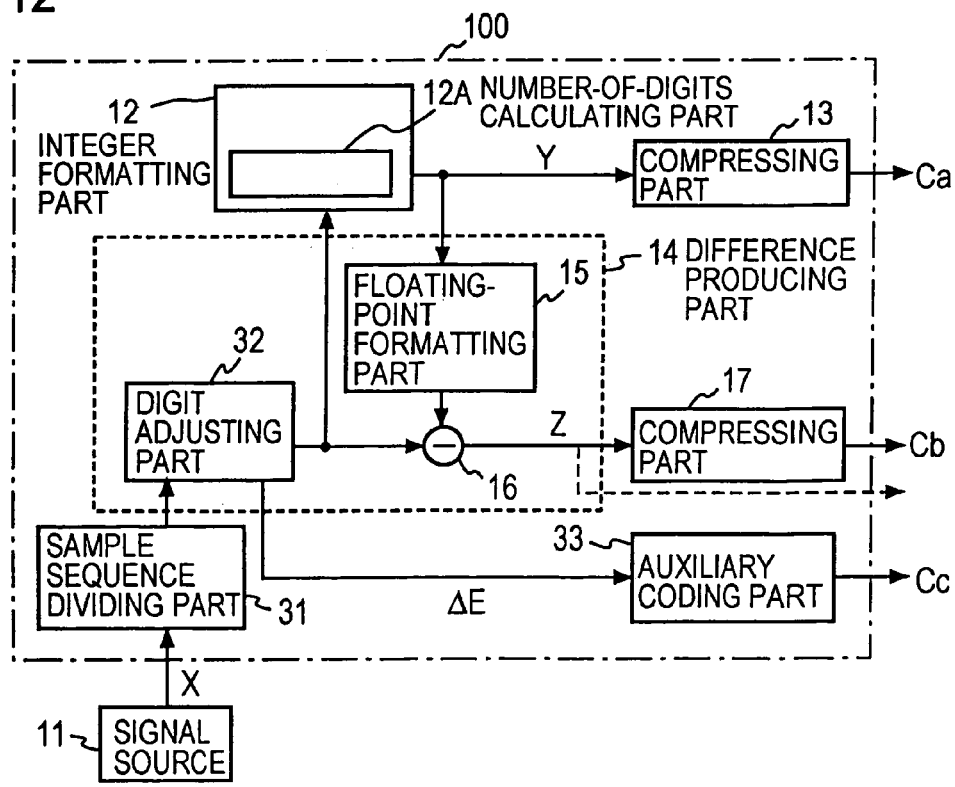
FIG. 12 is a functional diagram of a variation of the coder according to the second embodiment of the present invention.

As shown in FIG. 12, in which the parts corresponding to those in FIG. 9 are denoted by the same reference numerals, without performing the inverse digit adjustment of the digital signal sample Y, the digital signal sample Y in the integer format may be converted into a digital signal sample in the floating-point format by the floating-point formatting part 15, and the difference between the resulting digital signal sample in the floating-point format and the digital signal sample in the floating-point format having been adjusted in digit by the digit adjusting part 32 be determined, thereby producing the difference signal Z in the floating-point format. That is, as far as the difference producing part 14 determines, in the floating-point format, the difference signal between the original digital signal sample X in the floating-point format and the digital signal sample Y in the integer format, any of the arrangements shown in FIGS. 2, 9 and 12 can be used.

Figure 13:
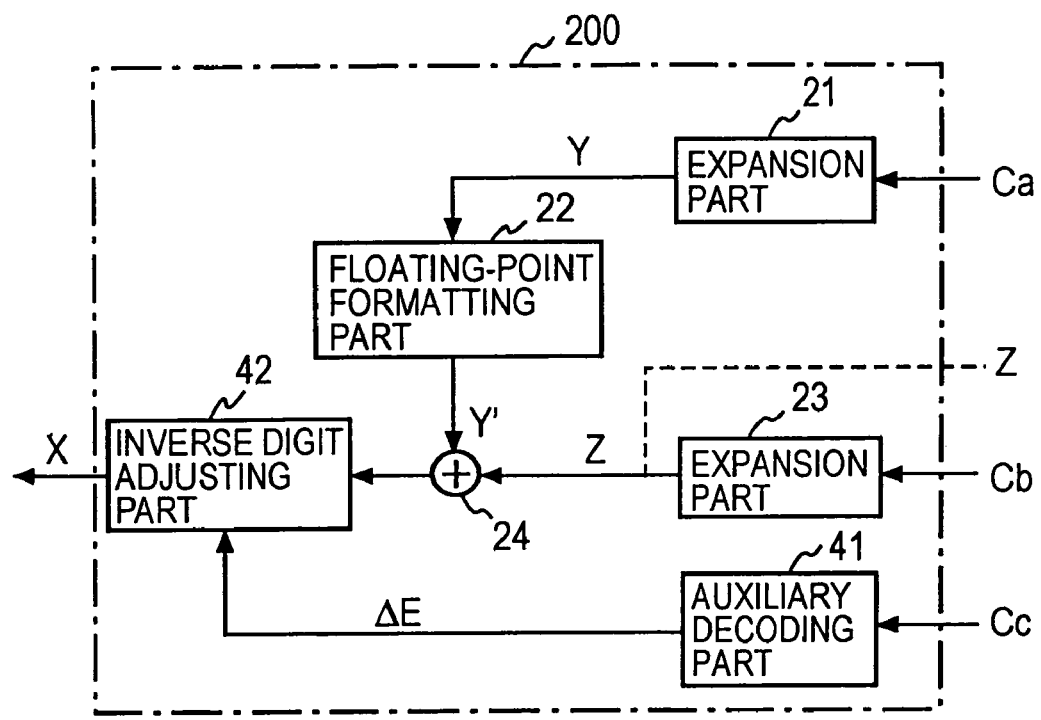
FIG. 13 is a functional diagram of a variation of the decoder according to the second embodiment of the present invention.

Associated with the coder shown in FIG. 12, the decoder 200 shown in FIG. 13 may reproduce the digital signal sample X in the floating-point format by first converting the digital signal sample Y in the integer format, which has been losslessly expansion-decoded by the expansion part 21, into a digital signal sample in the floating-point format by the floating-point formatting part 22, combining together the resulting digital signal sample and the difference signal Z in the floating-point format losslessly expansion-decoded by the expansion part 23 by the combining part 24, and then, adjusting the digit of the exponent E of the combination digital signal by the inverse digit adjusting part 42 using the adjusting information ΔE decoded by the auxiliary decoding part 41.

THIRD EMBODIMENT

In the embodiments described above, the compression efficiency is improved by taking advantage of the fact that all the bits constituting the integer part of the mantissa of the difference signal Z are "0" if the input signal sample X in the floating-point format is converted into an integer-value signal sample by truncating the fractional part below the decimal point. According to the third embodiment, in addition to truncating the bits below the decimal point, a predetermined number of bits of the integer part are also truncated to produce an integer-value signal sample Y In the following, there will be shown a case where, in the conversion into a 16-bit integer value through truncation of bits below the decimal point, 8 bits are further truncated. However, the present invention can be applied to cases of any conversion into an integer value composed of 17 bits to 23 bits.

According to the third embodiment, the input signal sample X in the floating-point format can be coded through the same process regardless of whether the original signal from which the input signal sample X has been derived is a floating-point signal, a 24-bit integer-value signal or a 16-bit integer-value signal. However, for convenience of explanation of the principle of operation, a case the input signal sample X is derived from a floating-point signal, a case where the input signal sample X is derived from a 24-bit integer-value signal containing one sign bit, and a case where the input signal sample X is derived from a 16-bit integer-value signal containing one sign bit will be described in order.

Figure 14A:
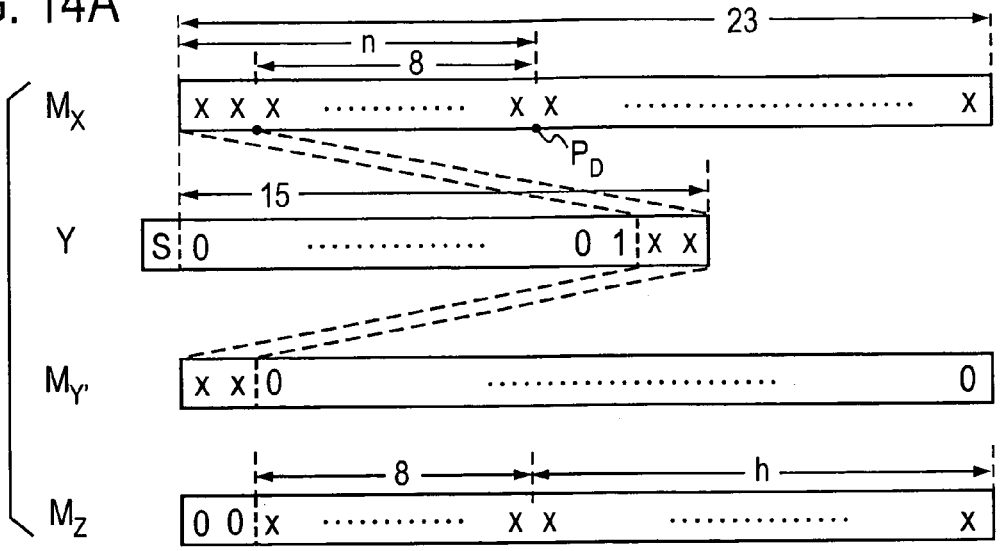
FIG. 14A is a diagram for illustrating a process of converting an input signal X in the floating-point format, which has been derived from a floating-point signal, into a 16-bit integer-value signal.

With reference to FIG. 14A, conversion of an input signal sample X derived from a floating-point signal into a 16-bit integer value, and production of a difference signal Z will be described. In this drawing, a value "x" can be "0" or "1" (that is, a value "x" can be non-zero). "$M_X$" represents 23 bits of the mantissa of the input signal sample X in the floating-point format, and "$P_D$" represents the position of the decimal point that indicates the boundary between the integer part constituted by the most significant n ($n=E-E_0$) bits and the fractional part. By reducing the exponent E of the sample X to E−8, the position of the decimal point $P_D$ of the mantissa $M_X$ is shifted toward the most significant bit position by 8 bits. As a result, in the example shown in FIG. 14A, the most significant 2 (n−8=2) bits "xx" of the mantissa $M_X$ constitute the integer part of the mantissa after shifting. Then, a bit "1" is added at the top of the 2 bits constituting the integer part, and the resulting sequence of bits "1xx" is used as the least significant bits of a 16-bit integer-value signal sample Y.

The 16-bit integer-value signal sample Y is shifted toward the most significant bit position by 8 bits, that is, 8 bits of "0" are added at the bottom of the 16-bit integer-value signal sample Y, and then, the resulting signal sample is converted into a signal sample Y' in the floating-point format. Thus, the exponent E of the resulting signal sample Y' in the floating-point format has been added with 8 and equals to the exponent E of the input signal sample X. The mantissa $M_{Y'}$ of the signal sample Y' is formed by setting, as the most significant bits, the bits of the integer part that follow the most significant "1" in the integer-value signal sample Y having been shifted toward the most significant bit position by 8 bits, that is, the 2 bits "xx" in this example and setting all the following bits at "0". For convenience, FIG. 14A shows a relation between the integer part following the most significant "1" in the sample Y yet to be shifted by 8 bits and the mantissa $M_{Y'}$ of the signal sample Y' in the floating-point format resulting from conversion. The mantissa $M_Z$ of the difference signal Z is the difference between the mantissa $M_X$ and the mantissa $M_{Y'}$. The most significant (n−8) bits of the mantissa $M_Z$ of the difference signal Z, or the most significant 2 bits in this example, are "00", and the following bits (fractional part) equal to the respective corresponding bits of the mantissa $M_X$. That is, all the bits that follow the most significant bits "00" constituting the integer part of the mantissa $M_Z$ can be non-zero.

As for the difference signal Z, only the least significant 23-(n−8) bits of the mantissa M that can be non-zero have to be coded. The number of the most significant (n−8) bits of the mantissa $M_z$ that are always set at 0 is the same as the total number of bits following the most significant "1" in the integer-value signal sample Y decoded on the receiving side. As shown in FIG. 15A, the part of the mantissa M constituted by bits that can be non-zero is reduced as the number of bits (n−8) of the integer part is increased.

Figure 14B:
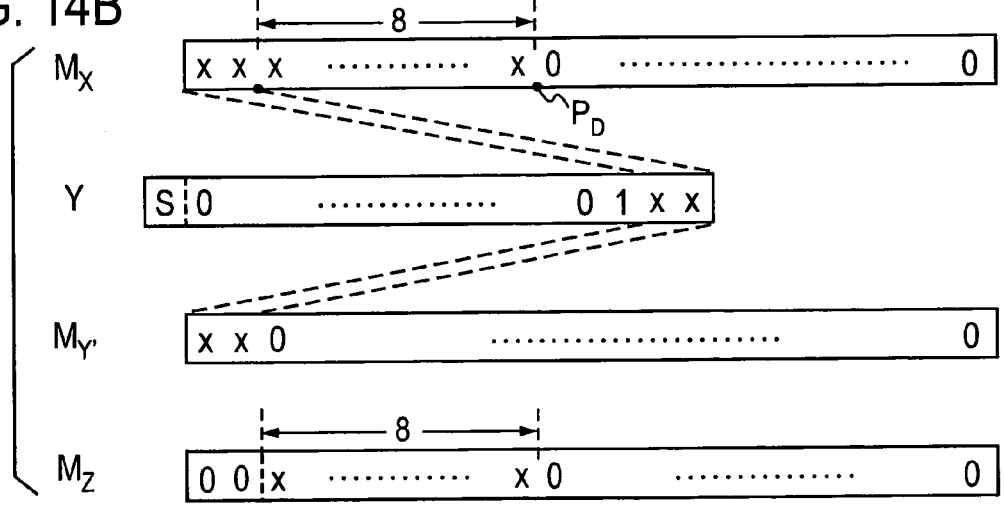
FIG. 14B is a diagram for illustrating a process of converting an input signal X in the floating-point format, which has been derived from a 24-bit integer-value signal, into a 16-bit integer-value signal.

FIG. 14B shows a case where the input signal sample X in the floating-point format is derived from a 24-bit integer-value signal. Therefore, the mantissa $M_X$ of the sample X differs from the mantissa $M_X$ shown in FIG. 14A in that all the bits following the decimal point $P_D$ are "0" as shown in FIG. 14B. In FIG. 14B, again, the exponent E of the input signal sample X is reduced to E−8, thereby shifting the position of the decimal point $P_D$ toward the most significant bit position by 8 bits. Then, the resulting 16-bit integer-value signal sample Y is the same as in the case shown in FIG. 14A. Therefore, the mantissa $M_{Y'}$ of the signal sample in the floating-point format converted from the integer-value signal sample Y is also the same as in the case shown in FIG. 14A.

However, the mantissa $M_Z$ of the difference signal is the difference between the mantissas $M_X$ and $M_{Y'}$, and as shown in FIG. 14B, the integer part of the mantissa $M_Z$ of the difference signal Z is "00", the following 8 bits represents a range of bits that can be non-zero, and the bits further following the 8 bits are all "0". The range of bits that can be non-zero is shifted toward the least significant bit position as the number of bits constituting the integer part, as shown in FIG. 15B.

Figure 14C:
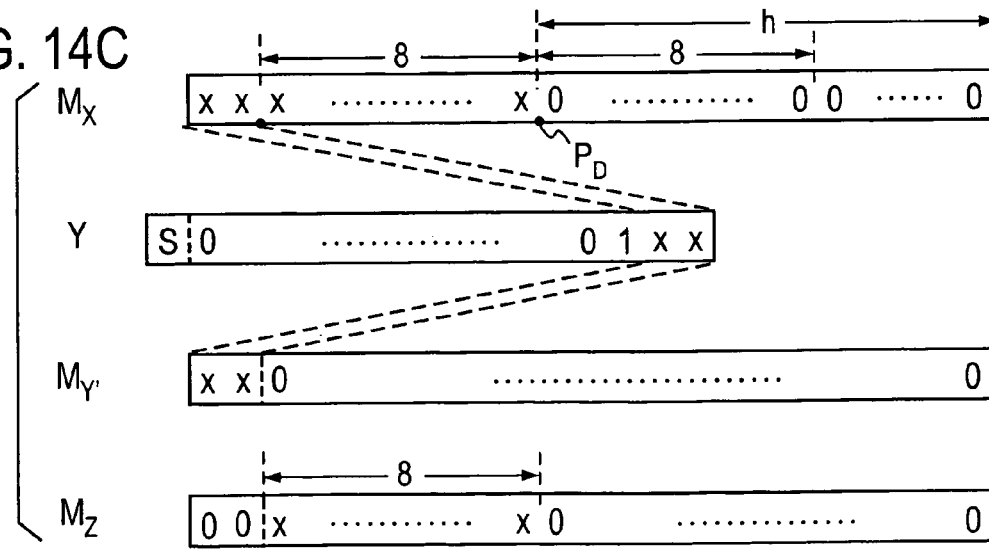
FIG. 14C is a diagram for illustrating a process of converting an input signal X in the floating-point format, which has been derived from a 16-bit integer-value signal, into a 16-bit integer-value signal.

FIG. 14C shows a case where the input signal sample in the floating-point format is derived from a 16-bit integer-value signal sample containing one sign bit. Therefore, in the 23-bit mantissa $M_X$, the 8 bits following the decimal point $P_p$ are all "0", and the bits following the 8 bits are also all "0". While the number of digits h following the decimal point varies with the value of n according to h=23−n, the case shown in FIG. 14C differs from the case shown in FIG. 14B in that the number of digits h does not become smaller than 8.

In FIG. 14C, again, the exponent E of the input signal sample X is reduced to E−8, thereby shifting the position of the decimal point $P_D$ toward the most significant bit position by 8 bits, and a 16-bit integer-value signal sample Y is produced using the integer part "xx" of the mantissa after shifting in the same manner as shown in FIGS. 14A and 14B. Therefore, the mantissa $M_{Y'}$ of the sample in the floating-point format converted from the sample Y is also the same as in the case shown in FIGS. 14A and 14B. In addition, as in the case shown in FIG. 14B, the most significant (n−8) bits of the integer part of the mantissa $M_Z$ of the difference signal Z are all "0", the following 8 bits represents a range of bits that can be non-zero, and the bits further following the 8 bits are all "0". In this case also, as shown in FIG. 15B, as the number of digits (n−8) of the integer part increases, the number of digits "0" following the 8 bits that can be non-zero decreases, although the number of digits does not become smaller than 8.

As can be apparent from the above description, in the case where the input signal sample in the floating-point format is derived from whichever one of a 24-bit integer-value signal, a 16-bit integer-value signal or a floating-point signal, the 16-bit integer-value signal sample Y can be produced through 8-bit truncation by shifting the decimal point toward the most significant bit position by 8 bits by reducing the exponent E of the input signal sample X to E−8, adding "1" at the top of the most significant (n−8) bits constituting the integer part of the mantissa $M_X$, or the bits "xx" in the example shown in the drawings, and adopting the resulting integer value "1xx" as the least significant bits of the 16-bit integer-value signal sample Y In addition, the mantissa $M_Z$ of the difference signal Z can result from setting the most significant (n−8) bits of the mantissa $M_X$ of the input signal sample X at "0".

The 16-bit integer-value signal sample Y thus obtained can be compression-coded in the same manner as in the embodiment shown in FIG. 2. On the other hand, as for the difference signal Z, the most significant (n−8) bits of the mantissa $M_Z$ that are always "0" are not coded, and the following 8 bits that can be non-zero and the remaining (23−n) bits further following the 8 bits are compression-coded separately.

In the examples described above, the 16-bit integer value is produced by shifting the decimal point in the 23-bit mantissa toward the most significant bit position by 8 bits and truncating the bits following the shifted decimal point. In general, m bits (m: any integer falling within a range $22 \geq m \geq 8$) can be truncated by reducing the exponent E of the input signal sample to E−m and adopting the most significant (n−m) bits of the resulting mantissa $M_X$ as the integer part. In addition, the mantissa of the difference signal Z can be coded efficiently if the most significant (n−m) bits that are always "0" are not, coded, and the following m bits that can be non-zero and the remaining (23−n) bits further following the m bits are coded separately.

Figure 16:
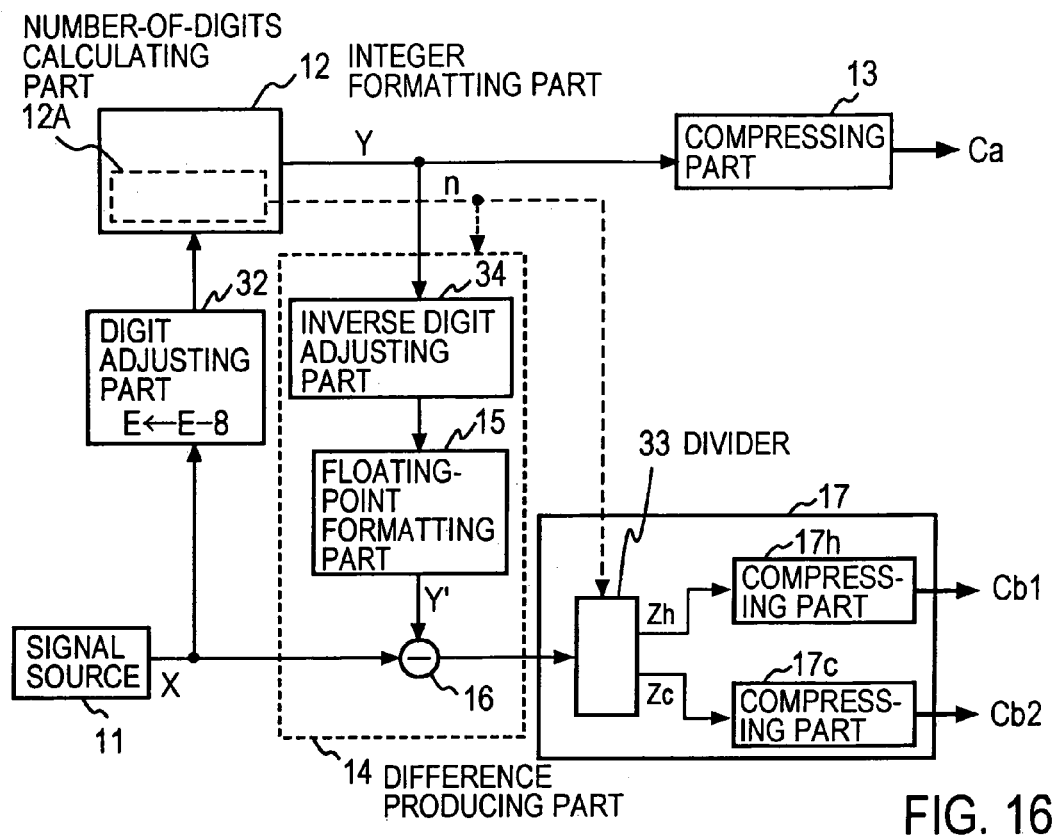
FIG. 16 is a functional diagram of a coder according to a third embodiment of the present invention.

FIG. 16 shows a coder, in which the parts corresponding to those shown in FIG. 2 are denoted by the same reference numerals. As described above with reference to FIGS. 14A, 14B and 14C, a digit adjusting part 32 reduces the exponent E of the input signal sample X in the floating-point format to E−8, thereby shifting the decimal point toward the most significant bit position by 8 bits. An integer formatting part 12 truncates the fractional part following the decimal point having been shifted by 8 bits and adds "1" at the top of the resulting integer part to form a 16-bit (=24−8) signal sample Y in the integer format. A compressing part 13 losslessly compresses the signal sample Y and outputs a code sequence Ca.

An inverse digit adjusting part 34 shifts the signal sample Y in the 16-bit integer format by 8 bits in the direction opposite to the shifting by the digit adjusting part 32, that is, inserts 8 bits of "0" at the bottom of the 16-bit signal sample Y to shift the whole signal sample Y by 8 bits toward the most significant bit position, thereby forming a 24-bit signal sample in the integer format. A floating-point formatting part 15 converts the resulting signal sample in the 24-bit integer format into a signal sample Y' in the floating-point format. A subtraction part 16 calculates the difference between the signal sample Y' in the floating-point format and the input signal sample X, thereby producing a difference signal Z in the floating-point format. Actually, such processings by the inverse digit adjusting part 34, the floating point formatting part 15 and the subtraction part 16 are not performed, and a difference producing part 14 can simply use the number of digits n of the integer part of the mantissa received from the integer formatting part 12 to extract the least significant 8+h (h=15−n) bits of the mantissa $M_x$ of each input signal sample X in the case where n≠0, or to extract the exponent E and the mantissa $M_x$ in the case where n=0.

A compressing part 17 comprises a divider 33 and two compressing parts 17h and 17c. The difference signal Z is input to the divider 33. The divider 33 receives also the number of digits n of the integer part of the mantissa of each sample X after shifting from the integer formatting part 12. In the case where n≠0, each difference signal sample Z is divided into a digit subset Zh containing bits capable of being non-zero determined by the number of digits n, that is, containing the least significant h bits (h=15−n) and a digit subset Zc containing bits capable of being non-zero determined by the conversion of the signal sample Y from the 24-bit integer format into the 16-bit integer format or determined by the number of bits of the signal sample Y in the integer format, that is, containing the (h+1)th to (h+8)th least significant bits. In the case where n =0, each difference signal sample Z is divided into a digit subset Zh composed of 8 bits of the exponent E and the least significant (23−8) bits of the mantissa and a digit subset Zc composed of the most significant 8 bits of the mantissa. The compressing parts 17h and 17c losslessly compression-code the digit subsets Zh and Zc by entropy coding or the like and output code sequences Cb1 and Cb2, respectively.

Therefore, the compressing part 17h primarily receives and losslessly compression-codes the least significant bit(s) of the mantissa M that can be non-zero. If the original digital signal is a 24-bit or 16-bit integer-value signal, the least significant h bits in the digit subset Zh input to the compressing part 17h are all "0" except the case where n=0 as shown in FIGS. 14B and 14C, and thus, efficient compression thereof can be achieved.

As shown in FIGS. 14A, 14B and 14C, the compressing part 17c losslessly compression-codes the 8 least significant bits that can be non-zero, that is, the (h+1)th to (h+8)th least significant bits, regardless of whether the input signal sample X is derived from a general floating-point signal, a 24-bit integer-value signal or a 16-bit integer-value signal. This enables improvement of the total compression efficiency, compared with the case where all the bits that can be non-zero in the difference signal Z are collectively compression-coded by the compressing part 17.

Figure 17:
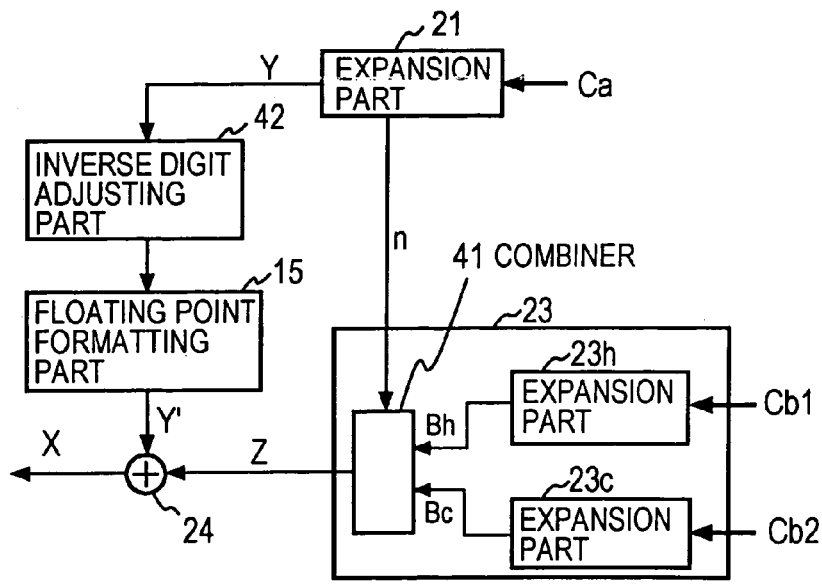
FIG. 17 is a functional diagram of a decoder according to a third embodiment of the present invention.

FIG. 17 shows a decoder according to this embodiment associated with the coder shown in FIG. 16, whose parts corresponding to those of the decoder shown in FIG. 8 are denoted by the same reference numerals. An expansion part 21 losslessly expansion-decodes the code sequence Ca to reproduce the signal sample Y in the 16-bit integer format. An expansion part 23 comprises two expanders 23h and 23c and a combiner 41. The code sequences Cb1 and Cb2 are losslessly expansion-decoded by the expanders 23h and 23c, respectively, and the resulting bit sequences Bh and Bc are input to the combiner 41. The combiner 41 receives also the number of bits n following the most significant "1" in the integer part of each sample decoded by the expansion part 21. In the case where n≠0, h (=15−n) bits are extracted from the bit sequence Bh output from the expander 23h, 8 bits are extracted from the bit sequence Bc output from the expander 23c, and the h bits and the 8 bits are combined to constitute the least significant h bits and the most significant 8 bits of the mantissa M, respectively. For the following samples, similarly, depending on the number of digits n, h bits are extracted from the bit sequence Bh, 8 bits are extracted from the bit sequence Bc, and the extracted bits are combined. In the case where n=0, 8 bits as the exponent E and 15 (=23−8) bits are extracted from the bit sequence Bh, and 8 bits are extracted from the bit sequence Bc. The 8 bits extracted from the bit sequence Bc are inserted at the top of the 15 bits from the bit sequence Bh, thereby forming the 23-bit mantissa.

An inverse digit adjusting part 42 inserts 8 bits of "0" at the bottom of the decoded signal sample Y in the 16-bit integer format to shift the signal sample Y by 8 bits toward the most significant bit position, thereby producing a signal sample in the 24-bit integer format. Then, a floating point formatting part 15 converts the signal sample into a signal sample Y' in the 32-bit floating-point format. A combining part 24 combines the signal sample Y' and the difference signal Z to reproduce the signal sample X in the floating-point format.

In the above description, the signal sample Y in the integer format is a 16-bit sample or a 24-bit sample. However, the number of bits contained in the signal sample Y may be any number m equal to or less than 24, and depending on the value of m, the number of digits capable of being non-zero in each signal sample Y in the integer format can be determined. Furthermore, in the example described above, a sequence of input signal samples X in the floating-point format may be divided into frames of 1024 samples, for example, or into blocks of consecutive samples, and compression coding may be performed for each of such divisional units. In the case where compression coding is performed for each divisional unit, the number of bits converted into the integer format may be suitably determined for each divisional unit, and an auxiliary code that specifies that number of bits may be output.

As the compressing part 17 in the coder shown in FIG. 16, the compressing part 17 according to the first embodiment shown in FIG. 2 may be used, and as the expansion part 23 in the decoder shown in FIG. 17, the expansion part 23 shown in FIG. 8 may be used. In such a case, the coder performs the 16-bit integer formatting described with reference to the second embodiment. However, the difference signal Z is not divided into two parts whose bits can be non-zero, and the least significant h (=23−n) bits of the mantissa are coded. Thus, the expansion part 23 in the decoder decodes the code sequence Cb to reproduce the h bits, and inserts n bits of "0" at the top of the h bits to produce the mantissa.

FOURTH EMBODIMENT

In the first embodiment described above, the least significant h (=23−n) bits that can be non-zero in each difference signal sample Z are losslessly compression-coded. However, for example, difference signals Z may be grouped into a frame, and a bit sequence may be extracted from the difference signals Z along the frame direction and losslessly compression-coded. Such a coding method will be described with reference to FIG. 18.

FIG. 18 shows a case where one frame is composed of 1024 samples. In addition, for each sample number i (i=0 to 1023), there are shown an integer value of the n-bit integer part of the mantissa of the input signal sample X ($n=E-E_0$) and a bit sequence of the h-bit fractional part thereof (h=23−n). As described in the first embodiment with reference to FIG. 7, the most significant n bits of the integer part of the mantissa M of each difference signal sample Z are all "0", and the least significant h (=23−n) bits of the fractional part are bits that can be non-zero. In the coding method shown in FIG. 18, the least significant h bits of the mantissas of the difference signals are arrayed with their respective most significant bits MSB aligned with each other, a bit at a bit position j along the amplitude direction is extracted from each sample, the bits at a bit position j along the amplitude direction in the respective samples are extracted and arranged in the frame direction to form a bit sequence $E_j$, and the bit sequence $E_j$ is coded.

The bit length h (=23−n) of the fractional part varies with the sample. Thus, in scanning the bits in the frame direction at the bit position j (j=0 to $h_{max}−1$; $h_{max}$ represents the maximum bit length of the fractional part of the samples in the relevant frame) in the amplitude, if a sample that has no bit at the bit position j is encountered, the sample is skipped. Whether to skip a sample i or not can be determined as follows: at the bit position j in the amplitude of the sample i, the bit length h of the fractional part of the sample is compared with the value j, and if h≧j, the bit at the bit position is extracted, and if h<j, the sample is skipped, and the same determination concerning the next sample (i+1) is made.

For example, in the scanning, in the frame direction, of bits at the bit position j=17 from the MSB, the sample i=0, whose bit length h of the fractional part is 23−6=17, has the least significant bit at the bit position j. However, the sample i=1, whose bit length of the fractional part is 23−8=15, has no bits following the 15th MSB (or bit position j=14). Thus, the sample i=1 is skipped. The extracted 15th bits are grouped for the frame to form a bit sequence $E_{16}$, and the bit sequence $E_{16}$ is entropy-coded. The same process is performed for each of the other bit positions j. As the entropy coding, arithmetic coding or Golomb coding is advantageous because layering can be provided.

On the decoder side, the number of digits n of the integer part can be determined from the number of bits n following the most significant "1" in each decoded integer-value signal sample Y, and therefore, the bit length h (=23−n) of the fractional part of the mantissa of each difference signal Z in the frame can be determined. Thus, for each of the decoded bit sequences $E_j$, the bits for the samples i in the frame are scanned sequentially, and the bit position j along the amplitude direction is compared with the bit length h for each sample. If j≦h, the fractional part of the mantissa shown in FIG. 18 can be reproduced by allocating the value of the bit in the bit sequence $E_j$ to the bit position (i, j). Then, at the top of the fractional part of each sample, n bits of "0" associated with the sample can be added, thereby reproducing the 23-bit mantissa M of the difference signal.

Figure 19:
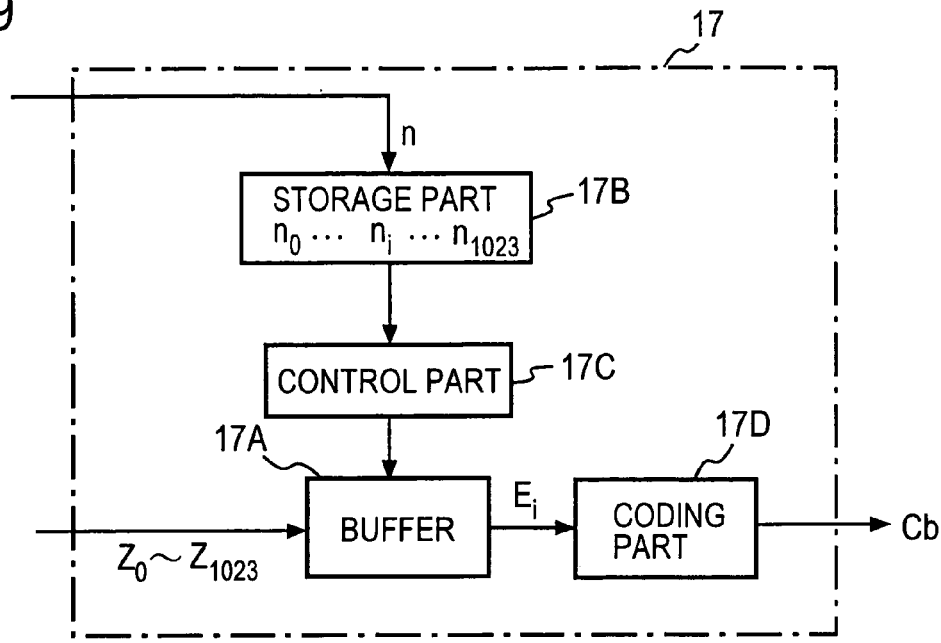
FIG. 19 shows a configuration of a compressing part 17 that performs the coding shown in FIG. 18.

FIG. 19 shows a functional configuration of the compression-coding part 17 shown in FIG. 2 to which the coding method shown in FIG. 18 is applied. The compression-coding part 17 receives one frame of samples $z_0$–$z_{1023}$ of the difference signal Z from the difference producing part 14 (see FIG. 2) and stores the numbers of digits $n_0$–$n_{1023}$ of their respective integer parts thereof in a storage part 17B. Based on the number of digits $n_i$ of each sample i, a control part 17C places h-bit integer part (h=23−n) of the mantissa of the input difference signal $Z_i$ excluding the most significant n bits in a buffer 17A. Thus, the array of the integer parts of the mantissas as shown in FIG. 18 is obtained. Then, the control part 17C scans, in the frame direction, the samples at the bit position j (=0 to $h_{max}−1$) in the amplitude, extracts the bits for which the relation of h≧j is satisfied to form a bit sequence $E_j$, and supplies the bit sequence $E_j$ to a compressor 17D. The buffer 17A, the storage part 17B and the control part 17C constitute bit sequence producing means. The compressor 17D losslessly compression-codes the bit sequence $E_j$ and outputs a code Cb.

Figure 20:
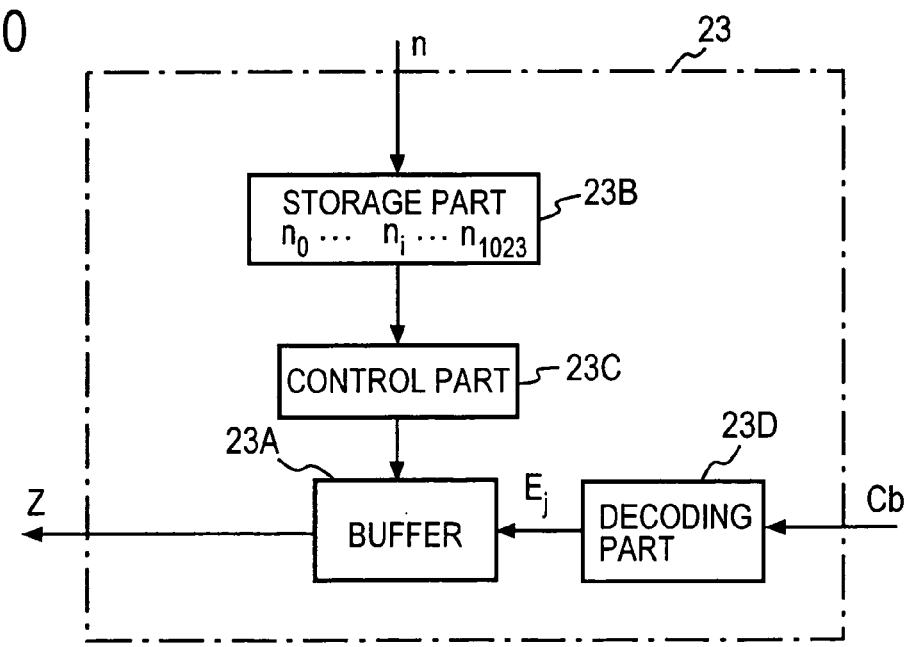
FIG. 20 shows a configuration of an expansion part 23 in a decoder corresponding to the compression part shown in FIG. 19.

FIG. 20 shows a functional configuration of the expansion part 23 serving as difference signal decoding means in FIG. 7 that is associated with the compression-coding part 17 shown in FIG. 19. A decoding part 23D decodes the received code Cb to reproduce the bit sequence $E_j$. On the other hand, the numbers of digits $n_0$–$n_{1023}$ of the integer parts for one frame, which are received from the number-of-digits calculating part 21A (FIG. 7), are stored in a storage part 23B, and a control part 23C allocates one bit extracted from the bit sequence $E_j$ to each bit position (i, j) for which the relationship of $h_i$≧j concerning the number of digits $h_i$ (=23−$n_i$) of the fractional part of each sample i is satisfied, and stores the resulting bit arrangement in a buffer 23A, and repeats the same process for all the samples, thereby reproducing the fractional-part bit array shown in FIG. 18. Once the bit arrangement of all the bit sequences $E_j$ (j=0–$h_{max}$−1) for one frame is completed, the control part 23C adds $n_i$ bits of "0" at the top of the fractional part of each sample i in the buffer 23A to reproduce the mantissa of the difference signal, and supplies the difference signal Z to the combining part 24 (FIG. 7). The buffer 23A, the storage part 23B and the control part 23C constitute reproducing means.

In the coding of the mantissa of the difference signal shown in FIG. 18, bits at a bit position j are grouped along the frame direction into a bit sequence $E_j$, and the bit sequence $E_j$ is coded. In the following, another method of scanning bit positions will be described. In FIG. 21, bits are scanned and collected, in the frame direction, continuously over a width of a predetermined number of plural bits in the amplitude direction in such a manner that the first of the bits at the bit position j+1 follows the last of the bits at the bit position j, thereby producing a plurality of bit sequences $E_{2'}$, $E_{18'}$ and so on. Thus, the number of bit sequences $E_j$ is less than the maximum number of bits $h_{max}$ of the fractional part. In this bit scanning, again, any bit position for which the relationship of $h_i$<j is satisfied is skipped. In the case of this bit scanning method, again, the number of digits of the fractional part of each sample i can be determined according to $h_i$=23−$n_i$. Thus, on the decoder side, the bit arrangement of the fractional part can be reproduced by allocating the bits in the bits sequences $E_j$ in the same manner as described above.

FIG. 22 shows another bit scanning method. According to the method shown in FIG. 21, continuous bit scanning in the frame direction over a width of plural bits in the amplitude direction is performed in such a manner that the first of the bits at the bit position j+1 follows the last of the bits at the bit position j. However, according to the method shown in FIG. 22, bits of a sample i are scanned, beginning with the MSB thereof, in the amplitude direction over the width of a predetermined number of plural bits, such that the last bit in the width of bits in the sample i is followed by the first bit in the width of plural bits in a sample i+1. Such scanning is repeated until the last sample in the frame is reached. In this example also, any bit position for which the condition $h_i$<j is satisfied is skipped.

FIG. 23 is a diagram for illustrating an exceptional operation in the bit scanning shown in FIG. 18. In the case where truncation makes the integer part 0, that is, in the case where the value of E−$E_0$ is negative, all the 32 bits including the exponent have to be coded and transmitted. Thus, as shown in FIG. 23, in the case where the integer part of the sample i=3 is 0 (that is, n=0), the compressing part 17 leaves the sample i=3 out of the bit scanning of the mantissas and codes the sample i=3 separately.

In the case where the input signal sample X is signal sample in the floating-point format that is converted from an integer value, and the number of digits of the original integer value differs from the number of digits of the truncated integer value, that is, in the case where a signal sample in the floating-point format directly converted from a 24-bit integer-value signal is coded into a 16-bit integer-value signal through truncation as described with reference to FIGS. 9B and 10B, the most significant 8 bits of the fractional part of the mantissa of the difference signal can be non-zero, although the remaining bits are 0. If such an input signal sample X is coded by the method shown in FIG. 13, for example, the bit sequences $E_0$ to $E_7$ can be non-zero, although the following bit sequences $E_8$ to $E_{21}$ are all "0", so that efficient coding can be achieved. It will be readily understood that efficient coding can be achieved similarly if the methods shown in FIGS. 21 and 22 are used.

As is performed in the audio signal processing as required, for example, if a 24-bit integer-value signal sample is increased 1.5-fold, the resulting signal sample is converted into a signal in the floating-point format, and the resulting signal is coded into a 16-bit integer-value signal through truncation, increasing the 24-bit integer-value signal sample 1.5-fold makes at least the first decimal place be a bit that can be non-zero. Specifically, the first place following the decimal point $P_D$ in the mantissa $M_X$ of the sample X shown in FIG. 14B can be non-zero. Therefore, the bits of the mantissa $M_Z$ of the difference signal that can be non-zero increases toward the least significant bit position by 1 bit to 9 bits. In this case also, the bits following the 9 bits are all "0", so that efficient coding can be achieved using the methods shown in FIGS. 18, 21, 22 and 23. Besides, if all the bits are not 0, the frequency of occurrence of non-zero (that is, "1") may vary with the digit place, and in such a case, the lossless coding can be applied suitably for the variation.

In any case, the numbers of digits capable of being non-zero in the fractional part of the mantissa of the difference signals counted from the side of the MSB are equal, so that efficient compression coding can be achieved.

The mantissa coding methods shown in FIGS. 18 to 23 have been described on the assumption that the methods are applied to the first embodiment shown in FIG. 2. However, the methods can be applied to a case where a 16-bit integer value is formed through truncation as described with reference to FIGS. 14A to 17. In such a case, the compressing part 17 shown in FIG. 16 is reconfigured as shown in FIG. 19, and the expansion part 23 shown in FIG. 17 is reconfigured as shown in FIG. 20.

In addition, the samples can be rearranged for scanning based on the number of digits of the fractional part. For example, the samples whose fractional part is composed of 23 digits are grouped together, the samples whose fractional part is composed of 22 digits are then grouped together, and samples having fractional parts composed of less numbers of digits are grouped together in the same way. The inverse arrangement of the samples can be achieved in a unique manner without the need of any additional information, so that the number of samples to be scanned can be simply managed.

FIFTH EMBODIMENT

Figure 24:
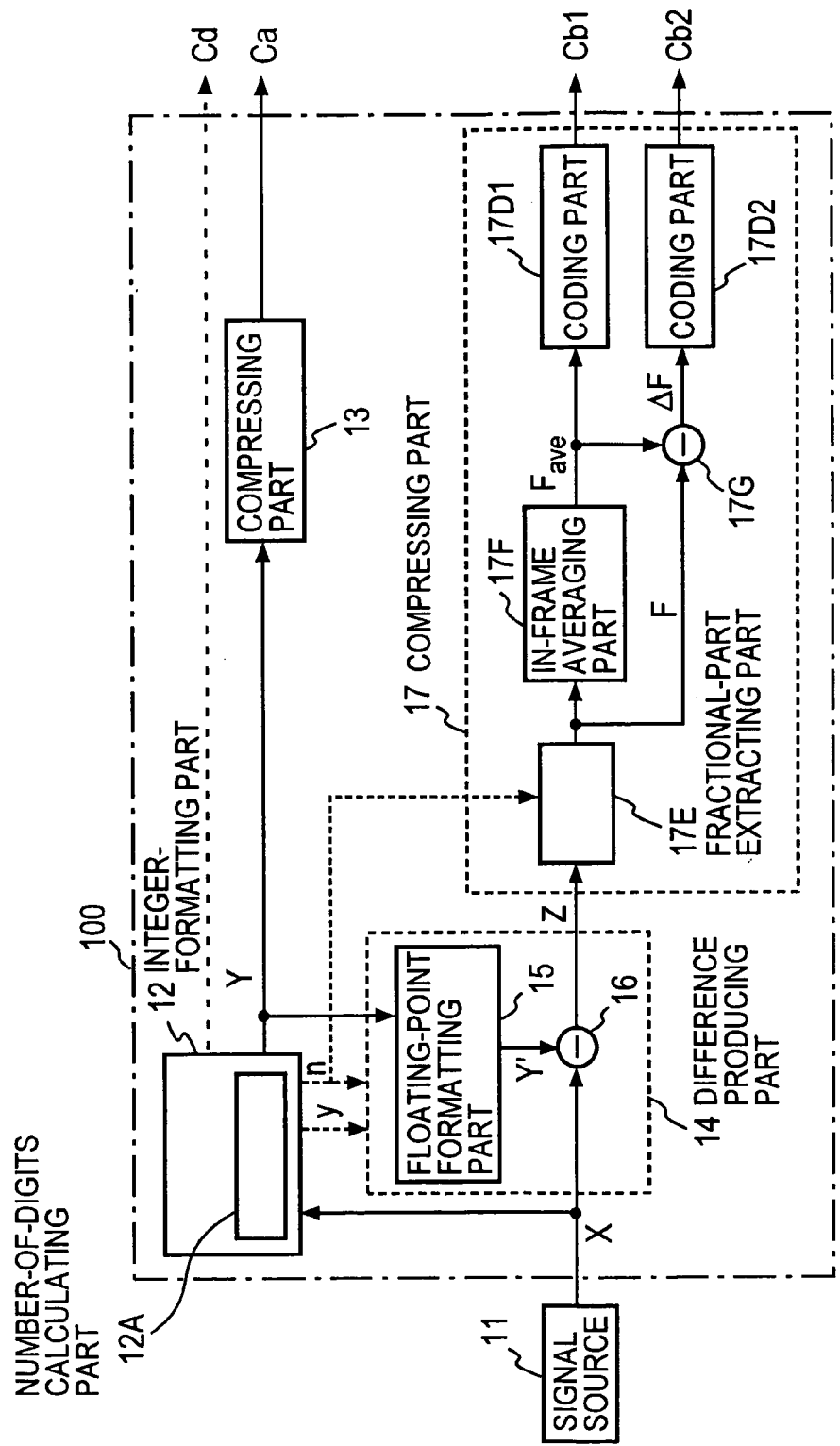
FIG. 24 is a functional diagram of a coder according to a fifth embodiment.

In the fourth embodiment described above, bit sequences are extracted, along the sample-sequence direction, from the fractional parts of the mantissas M of the difference signals Z that are arranged with the MSBs thereof aligned with each other in each frame, and the extracted bit sequences are coded. According to a fifth embodiment, an integer-value sample sequence is formed by arranging the fractional parts containing bits capable of being non-zero with the LSBs thereof aligned with each other, and compression coding is performed by eliminating the redundancy in the sample-sequence direction. FIG. 24 shows a configuration of the coder 100 shown in FIG. 2 to which the fifth embodiment is applied.

The coder 100 shown in FIG. 24 differs from the coder 100 shown in FIG. 2 in the configuration of the compression-coding part 17. As shown in FIG. 24, the compression-coding part 17 comprises a fractional-part extracting part 17E, an in-frame averaging part 17F, a subtracter 17G and coding parts 17D1 and 17D2. The fractional-part extracting part 17E extracts, as one integer-value sample F, the fractional part composed of the least significant h bits (h=23−n) of the mantissa M of each difference signal sample Z received from the difference producing part 14. The in-frame averaging part 17F calculates the average $F_{ave}$ of the extracted integer-value samples for each frame, and the coding part 17D1 codes the average $F_{ave}$ and outputs the resulting code sequence Cb1. The subtracter 17G determines the difference between the average $F_{ave}$ and each integer-value sample F as an error sample ΔF, and the coding part 17D2 predictive-codes the error sample ΔF, losslessly compression-codes a prediction error and outputs the resulting code sequence Cb2. The predictive parameter may be separately transmitted as auxiliary information, or may be adaptively updated with the consistency being kept between the coder and the decoder.

Figure 25:
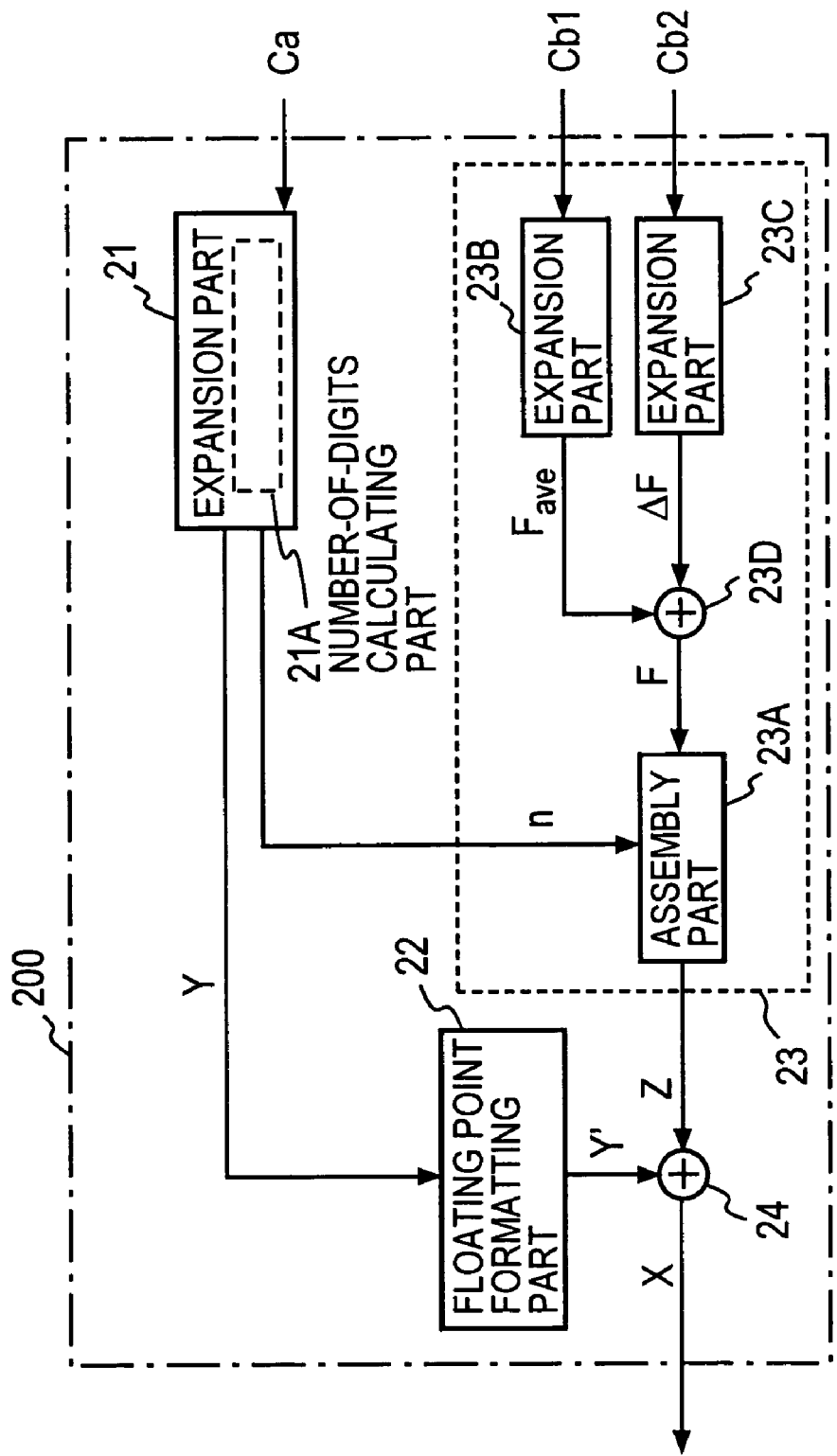
FIG. 25 is a functional diagram of a decoder according to a fifth embodiment.

FIG. 25 shows a decoder associated with the coder shown in FIG. 24. This configuration is the same as that of the decoder shown in FIG. 8 except that the expansion part 23 is modified. According to this embodiment, the expansion part 23 comprises expanders 23B and 23C, an adder 23D and an assembly part 23A. The expander 23B expansion-decodes the received code sequence Cb1 and outputs the average $F_{ave}$ for each frame. The expander 23C expansion-decodes the received code sequence Cb2 to determine the prediction error, performs predictive decoding and outputs the error sample ΔF. The adder 23D sums the average $F_{ave}$ and the error sample ΔF to reproduce the integer-value sample F. The assembly part 23A assembles the difference signal Z from the integer-value sample F using the number of digits n from the number-of-digits calculating part 21A. The resulting difference signal Z and the signal sample Y' in the floating-point format, which is converted from the integer-value signal sample Y, are combined into the signal sample X as in the case shown in FIG. 8.

This fifth embodiment can be applied to the third embodiment simply by replacing the compression-coding part 17 in FIG. 16 and the expansion part 23 in FIG. 17 with the compression-coding part 17 in FIG. 24 and the expansion part 23 in FIG. 25, respectively.

Figure 26:
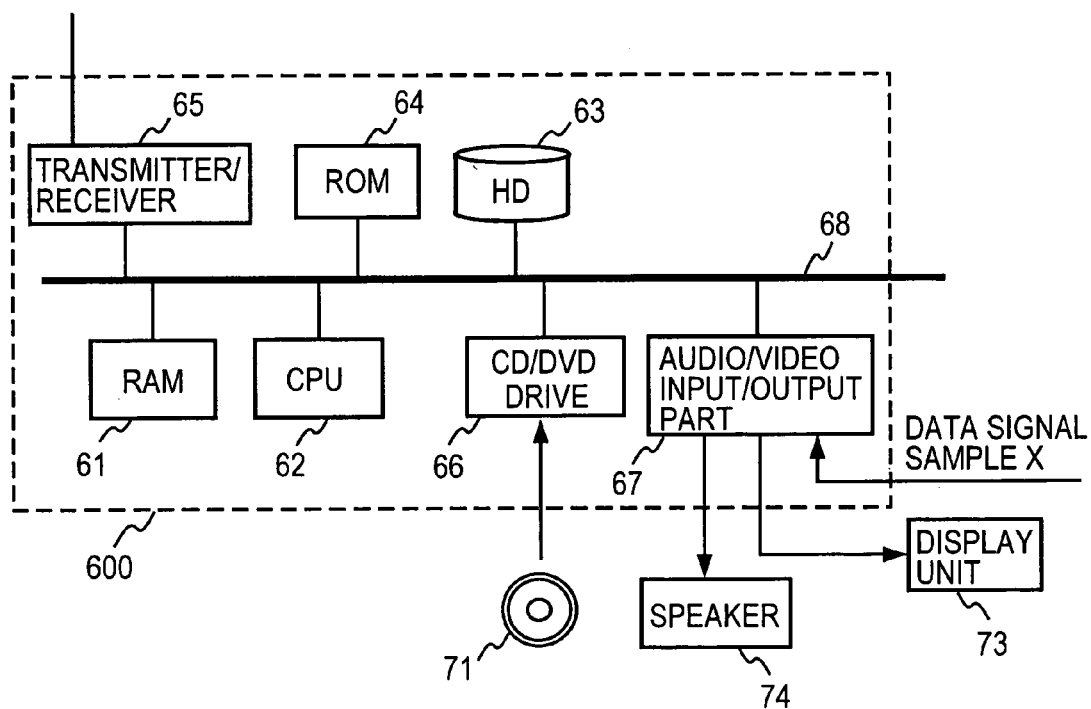
FIG. 26 shows a configuration of a computer on which the present invention is implemented.

[Implementation by Computer] As shown in FIG. 26, the coder 100 shown in FIGS. 2, 9, 12, 16 and 24 can be implemented by a computer 600 comprising a RAM 61, a CPU 62, a hard disk 63, a ROM 64, a transmitter/receiver 65, an input/output part 66 and an audio/video input/output part 67, which are interconnected via a bus 68.

The ROM 64 stores a program for booting the computer, and the hard disk 63 stores an operating system program for the computer. A program for executing a function of the coder 100 according to the present invention is previously read into the hard disk 63 from a recording medium 71, such as CD-ROM and DVD, via the CD/DVD drive 66, or previously downloaded to the hard disk 63 through a communication line and the transmitter/receiver 65.

The sequence of digital signal samples X in the floating-point format to be coded is externally received at the audio/video input/output part 67, for example, and temporarily stored in the hard disk 63, which serves as a buffer. To start coding, a program for executing coding is read into the RAM 61 from the hard disk 63, and the program is executed by the CPU 62. The result of coding, such as the codes Ca, Cb(or Z) and Cc, may be transmitted from the transmitter/receiver 65 to the outside via the communication line, or may be stored in a recording medium 65, such as CD and DVD, in the CD/DVD drive 66.

Similarly, in order to implement the decoder 200 shown in FIGS. 8, 11, 13, 17 and 25 by the computer shown in FIG. 26, a program for executing a function of the decoder is stored in the hard disk 63, and a decoding program is executed on the codes Ca, Cb (or Z) and Cc received at the transmitter/receiver 65 through the communication line. The result of coding is output to a display unit 73 and a speaker 74 for reproduction.

The present invention can be applied not only to music signals but also to sound signals, image signals and the like.

What is claimed is:

1. A lossless coding method for a digital signal in a floating-point format, comprising:
   (a) a step of converting a first signal sample in the floating-point format into a second signal sample in an integer format by truncation so that the absolute value thereof is reduced;
   (b) a step of losslessly compressing said second signal sample in the integer format to produce a first code sequence and outputting the first code sequence;
   (c) a step of producing a difference signal in the floating-point format that corresponds to the difference between said second signal sample in the integer format and said first signal sample in the floating-point format; and
   (d) a step of producing and outputting a second code sequence that corresponds to digits capable of being non-zero in said difference signal in the floating-point format, the digits being determined by the absolute value of said second signal sample in the integer format.

2. A coding method according to claim 1, in which said step (d) comprises a step of losslessly compressing said digits capable of being non-zero to produce said second code sequence.

3. A coding method according to claim 2, in which said digits capable of being non-zero corresponds to a fractional part following a decimal point in a mantissa of said first signal sample.

4. A coding method according to claim 2, in which said step (a) comprises:
   (a-1) a step of detecting, for each of blocks each containing a plurality of first signal samples in the floating-point format, a maximum value of exponents of the first signal samples;
   (a-2) a step of adjusting the values of the exponents of the first signal samples in the relevant block by an adjustment value determined based on the detected maximum value so that the maximum of the numbers of digits of integer values converted from the first signal samples in the relevant block be a predetermined value;
   (a-3) a step of converting the first signal samples in the floating-point format in the relevant block whose exponents have been adjusted into the integer format; and
   (a-4) a step of coding adjustment information corresponding to said adjustment value to produce an auxiliary code, and
   wherein said auxiliary code is also output in said step (d).

5. A coding method according to claim 2, in which the number of bits $b_I$ of said second signal sample in the integer format is equal to or less than the number of bits $b_M$ of a mantissa of said first signal sample in the floating-point format, and
   said step of producing the second code sequence comprises a step of dividing a range of said digits capable of being non-zero in the mantissa of said first signal sample, into a higher-significant bit position sub-range containing a number of bits corresponding to the difference between the number of bits $b_M$ of said mantissa and the number of bits $b_I$ of said second signal sample and a lower-significant bit position sub-range containing the remaining bits, losslessly compressing the sub-ranges separately, and outputting the resulting codes as said second code sequence.

6. A coding method according to claim 2, in which said step (d) comprises a step of arranging fractional parts, each of which is the digits capable of being non-zero, of mantissas of difference signal samples in each frame with the most significant bits thereof aligned with each other, selecting bits at least in the direction of arrangement of the samples to produce a plurality of bit sequences, and losslessly compressing the bit sequences to produce said second code sequence.

7. A coding method according to claim 1, in which said step (c) is a step of determining, for each frame, the average value of a sequence of integer-value samples, which correspond to the fractional parts of the difference signals in the relevant frame, performing error prediction about signals resulting from subtraction of the average value from the value of each integer-value sample, losslessly compression-coding the prediction errors, and coding the average value to form said second code sequence.

8. A decoding method for a digital signal in a floating-point format, comprising:
   (a) a step of decoding and expanding a first code sequence to produce a first signal sample in an integer format;
   (b) a step of producing a difference signal in the floating-point format from a second code sequence based on the number of digits capable of being non-zero that is determined by the absolute value of said first signal sample;
   (c) a step of converting said first signal sample in the integer format into a second signal sample in the floating-point format; and
   (d) a step of combining said second signal sample in the floating-point format and said difference signal in the floating-point format to produce a third signal sample in the floating-point format.

9. A decoding method according to claim 8, in which said step (b) is a step of decoding and expanding said second code sequence to produce a fractional part corresponding to the digits capable of being non-zero, and producing the difference signal in the floating-point format using the fractional part.

10. A decoding method according to claim 9, further comprising: a step of decoding an auxiliary code to produce adjustment information; and a step of performing digit adjustment of said first signal sample in the integer format or said combined signal according to said adjustment information.

11. A decoding method according to claim 9, in which said second code sequence includes a first code sub-sequence and a second code sub-sequence, and
said step (b) of producing the difference signal comprises:
(b-1) a step of decoding and expanding said first code sequence into a higher-order range of bits, the number of which is the difference between the number of bits of said first signal sample in the integer format and the number of bits of a mantissa of said third signal sample in the floating-point format;
(b-2) a step of decoding and expanding said second code sequence into a lower-order range of bits; and
(b-3) a step of producing said difference signal by adding the lower-order range of bits at the lower-order side of the higher-order range of bits to form the fractional part of the mantissa of the difference signal.

12. A decoding method according to claim 9, in which said step (b) comprises:
(b-1) a step of decoding and expanding said second code sequence to produce a plurality of bit sequences for each frame;
(b-2) a step of reproducing the fractional part of each difference signal in the relevant frame by scanning bits, the position of each of which is defined by the position in the direction of arrangement of samples in the relevant frame and the position in the amplitude direction in the relevant sample, at least in the direction of arrangement of samples and allocating bits in each of said bit sequences to the bit positions within a bit length of the fractional part, the bit length being determined by the absolute value of said first signal sample in the integer format corresponding to the scanned bits; and
(b-3) a step of reproducing the mantissa of each difference signal by inserting, at the top of the fractional part, the same number of "0"s as the number of bits following the most significant "1" in the corresponding first signal sample, thereby producing said difference signal.

13. A decoding method according to claim 8, in which said step (b) comprises a step of expansion-decoding said second code sequence to obtain the sample average value for each frame and a signal indicating a prediction error for each sample in the relevant frame excluding the average value, a step of producing the fractional part by adding said average value and the signal excluding the average value, and a step of producing the mantissa of the difference signal by inserting, at the top of the fractional part, the same number of "0"s as the number of bits following the most significant "1" in said integer value.

14. A lossless coder for a digital signal in a floating-point format, comprising:
an integer formatting part that converts an input first signal sample in the floating-point format into a second signal sample in an integer format by truncation so that the absolute value thereof is reduced;
a first compressing part that receives said second signal sample in the integer format and losslessly compresses the second signal sample to produce a first code sequence;
a difference producing part that produces a difference signal in the floating-point format that corresponds to the difference between said second signal sample in the integer format and said first signal sample in the floating-point format; and second code sequence producing means that produces and outputs a second code sequence that corresponds to digits capable of being non-zero in said difference signal in the floating-point format, the digits being determined by the absolute value of said second signal sample in the integer format.

15. A coder according to claim 14, in which said second code sequence producing means includes a second compressing part that losslessly compresses said difference signal and outputs the result of the compression as said second code sequence.

16. A coder according to claim 15, further comprising:
a digit adjusting part that detects, for each of blocks each containing a plurality of first digital signal samples in the floating-point format, the maximum value of the exponents of the first digital signal samples and adjusts the values of the exponents of the first digital signal samples in the relevant block by an adjustment value determined based on the detected maximum value so that the maximum of the numbers of digits of integer values converted from the first digital signal samples in the relevant block be a predetermined value; and
an auxiliary code producing part that codes adjustment information corresponding to said adjustment value to produce an auxiliary code and outputs the auxiliary code.

17. A coder according to claim 15, in which the number of bits $b_I$ of said second signal sample in the integer format is equal to or less than the number of bits $b_M$ of a mantissa of said first signal sample in the floating-point format, and
said second compressing part includes: a first compression-coding part that losslessly compression-codes a higher-significant bit position sub-range, which contains a number of bits corresponding to the difference between the number of bits $b_M$ of said mantissa and the number of bits $b_I$ of said second signal sample, of the range of said digits capable of being non-zero in the mantissa of said first signal sample, which is determined by the absolute value of said second signal sample in the integer format, to produce a first code sub-sequence; and a second compression-coding part that losslessly compression-codes a lower-significant bit position sub-range containing the remaining bits of the range of digits capable of being non-zero to produce a second code sub-sequence, the first code sub-sequence and the second code sub-sequence being output as said second code sequence.

18. A coder according to claim 15, in which said difference producing part includes a bit sequence producing part that produces a plurality of bit sequences by arranging factional parts, which are ranges of bits capable of being non-zero, of mantissas of difference signal samples in each frame with the most significant bits thereof aligned with each other, and selecting bits at least in the direction of arrangement of the samples, and said second compressing part losslessly compresses the bit sequences to produce said second code sequence.

19. A coder according to claim 15, in which said difference producing part includes: an average value calculating part that determines, for each frame, the average value of a sequence of integer-value samples, which correspond to the fractional parts of the difference signals in the relevant frame; a subtracter that determines the error between each integer-value sample and the average value; and a coding part that performs prediction of the error in the direction of arrangement of the samples, losslessly compression-codes the prediction error, and codes the average value to produce said second code sequence.

20. A decoder for a digital signal in a floating-point format, comprising:
- a first expansion part that receives a first code sequence and decodes and expands the first code sequence to produce a first signal sample in an integer format;
- difference signal decoding means that produces a difference signal in the floating-point format from a second code sequence based on the number of digits capable of being non-zero that is determined by the absolute value of said first signal sample;
- a floating point formatting part that receives said first signal sample in the integer format and converts the first signal sample into a second signal sample in the floating-point format; and
- a combining part receives said second signal sample in the floating-point format and said difference signal in the floating-point format and combines the second signal samples and the difference signal to produce a third signal sample in the floating-point format.

21. A decoder according to claim 20, in which said difference signal decoding means is means that decodes and expands said second code sequence to produce a fractional part corresponding to the digits capable of being non-zero, and produces the difference signal in the floating-point format using the fractional part.

22. A decoder according to claim 21, further comprising: an auxiliary decoding part that decodes an auxiliary code to produce adjustment information; and a digit adjusting part that performing digit adjustment of said first signal sample in the integer format or said combined signal according to said adjustment information.

23. A decoder according to claim 20, in which said second code sequence includes a first code sub-sequence and a second code sub-sequence, and
said difference signal decoding means includes: a third expansion part that decodes and expands said first code sequence in a higher-order range of bits, the number of which is the difference between the number of bits of said first signal sample in the integer format and the number of bits of a mantissa of said third signal sample in the floating-point format; a fourth expansion part that decodes and expands said second code sequence in a lower-order range of bits; and a combining part that produces said difference signal by adding the lower-order range of bits at the bottom of the higher-order range of bits to form the fractional part of the mantissa of the difference signal.

24. A decoder according to claim 20, in which said difference signal decoding means includes: a decoding part that decodes and expands said second code sequence to produce a plurality of bit sequences for each frame; and reproducing means that reproduces the fractional part of each difference signal in the relevant frame by scanning bits, the position of each of which is defined by the position in the direction of arrangement of samples in the relevant frame and the position in the amplitude direction in the relevant sample, at least in the direction of arrangement of samples and allocating bits in each of said bit sequences to the bit positions within a bit length of the fractional part, the bit length being determined by the absolute value of said first signal sample in the integer format corresponding to the scanned bits, and reproduces the mantissa of each difference signal by inserting, at the top of the fractional part, the same number of "0"s as the number of bits following the most significant "1" in the corresponding first signal sample, thereby producing said difference signal.

25. A decoder according to claim 20, in which said difference signal decoding means includes an expansion-decoding part that expansion-decodes said second code sequence to obtain the sample average value for each frame and an error corresponding to each sample in the relevant frame; an adder part that adds the average value to each error to produce the fractional part; and means of producing the mantissa of the difference signal by inserting, at the top of the fractional part, the same number of "0"s as the number of bits following the most significant "1" in said first sample.

26. A coding program that makes a computer execute each step of a lossless coding method for a digital signal in a floating-point format according to any one of claims 1 to 7.

27. A decoding program that makes a computer execute each step of a decoding method for a digital signal in a floating-point format according to any one of claims 8 to 13.

28. A computer-readable recording medium that stores a program according to claim 26.

29. A computer-readable recording medium that stores a program according to claim 27.

* * * * *

UNITED STATES PATENT AND TRADEMARK OFFICE
CERTIFICATE OF CORRECTION

PATENT NO. : 7,230,551 B2
APPLICATION NO. : 10/554739
DATED : June 12, 2007
INVENTOR(S) : Moriya et al.

It is certified that error appears in the above-identified patent and that said Letters Patent is hereby corrected as shown below:

On the title page, Item (75), the first inventor's city of residence is incorrect. Item (75) should read:
-- (75) Inventors: Takehiro Moriya, Tokyo (JP); Dai Yang, San Diego, CA (US) --

Signed and Sealed this

Twenty-eighth Day of August, 2007

JON W. DUDAS
*Director of the United States Patent and Trademark Office*